United States Patent
Peng et al.

(10) Patent No.: US 10,862,023 B2
(45) Date of Patent: Dec. 8, 2020

(54) SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Tai-Yen Peng, Hsinchu (TW); Yu-Shu Chen, Hsinchu (TW); Chien Chung Huang, Taichung (TW); Sin-Yi Yang, Taichung (TW); Chen-Jung Wang, Hsinchu (TW); Han-Ting Lin, Hsinchu (TW); Jyu-Horng Shieh, Hsin-Chu (TW); Qiang Fu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 3 days.

(21) Appl. No.: 16/242,689

(22) Filed: Jan. 8, 2019

(65) Prior Publication Data
US 2020/0035907 A1 Jan. 30, 2020

Related U.S. Application Data

(60) Provisional application No. 62/711,803, filed on Jul. 30, 2018.

(51) Int. Cl.
*H01L 29/82* (2006.01)
*H01L 43/02* (2006.01)
(Continued)

(52) U.S. Cl.
CPC ............. *H01L 43/02* (2013.01); *H01L 43/10* (2013.01); *H01L 43/12* (2013.01)

(58) Field of Classification Search
CPC ......... H01L 2924/0002; H01L 2924/00; H01L 21/76816; H01L 21/31144; H01L 23/5226; H01L 23/53295; H01L 21/0337; H01L 21/7684; H01L 21/76805; H01L 21/76885; H01L 23/53238; H01L 43/02; H01L 43/12; H01L 21/76807; H01L 21/76877; H01L 23/528; H01L 23/5329; C03C 3/097;
(Continued)

(56) References Cited

U.S. PATENT DOCUMENTS

2004/0080051 A1* 4/2004 Kawai ............... H01L 27/10817
257/758
2005/0227382 A1* 10/2005 Hui ................... H01L 21/67069
438/14

(Continued)

OTHER PUBLICATIONS

Memory Device and Fabrication Method Thereof, U.S. Appl. No. 15/799,416, filed Oct. 31, 2017, First Named Inventor Tai-Yen Peng.

*Primary Examiner* — Robert G Bachner
(74) *Attorney, Agent, or Firm* — WPAT, P.C., Intellectual Property Attorneys; Anthony King

(57) ABSTRACT

The present disclosure provides a semiconductor structure, including a bottom electrode via, a top surface of the bottom electrode via having a first width, a barrier layer surrounding the bottom electrode via, and a magnetic tunneling junction (MTJ) over the bottom electrode via, a bottom of the MTJ having a second width, the first width being narrower than the second width.

20 Claims, 47 Drawing Sheets

(51) Int. Cl.
*H01L 43/12* (2006.01)
*H01L 43/10* (2006.01)

(58) Field of Classification Search
CPC .............. C03C 10/0027; C03C 21/002; C03C 2204/00; C03C 10/0054; C03C 10/0009; C03C 4/02; C03C 3/093; C03C 4/0014; C03C 4/0021; C03C 4/18; C03C 3/19; C03C 2214/20; C03C 3/064; C03C 3/091; C03C 3/118; C03C 10/0018; C03C 14/004; C03C 2205/06; C03C 2214/04; C03C 2214/30; C03C 3/111; C03C 3/112; C03C 3/21; C03C 4/0007; C03C 4/0035; C03C 4/0092; C03C 4/16; C03C 10/00; C03C 10/0036; C03C 10/0045; C03C 10/16; C03C 11/002; C03C 12/00; C03C 13/00; C03C 21/005; C03C 2203/52; C03C 2204/04; C03C 2213/00; C03C 2213/02; C03C 3/062; C03C 3/085; C03C 3/087; C03C 3/145; C03C 3/16; C03C 3/17; C03C 3/247; C03C 4/005
See application file for complete search history.

(56) References Cited

U.S. PATENT DOCUMENTS

| | | | |
|---|---|---|---|
| 2010/0181633 A1* | 7/2010 | Nam | B82Y 25/00 257/421 |
| 2011/0012229 A1* | 1/2011 | Hsu | H01G 4/228 257/532 |
| 2015/0061052 A1* | 3/2015 | Huang | H01L 43/02 257/421 |
| 2015/0325622 A1* | 11/2015 | Zhang | H01L 43/12 257/421 |

* cited by examiner

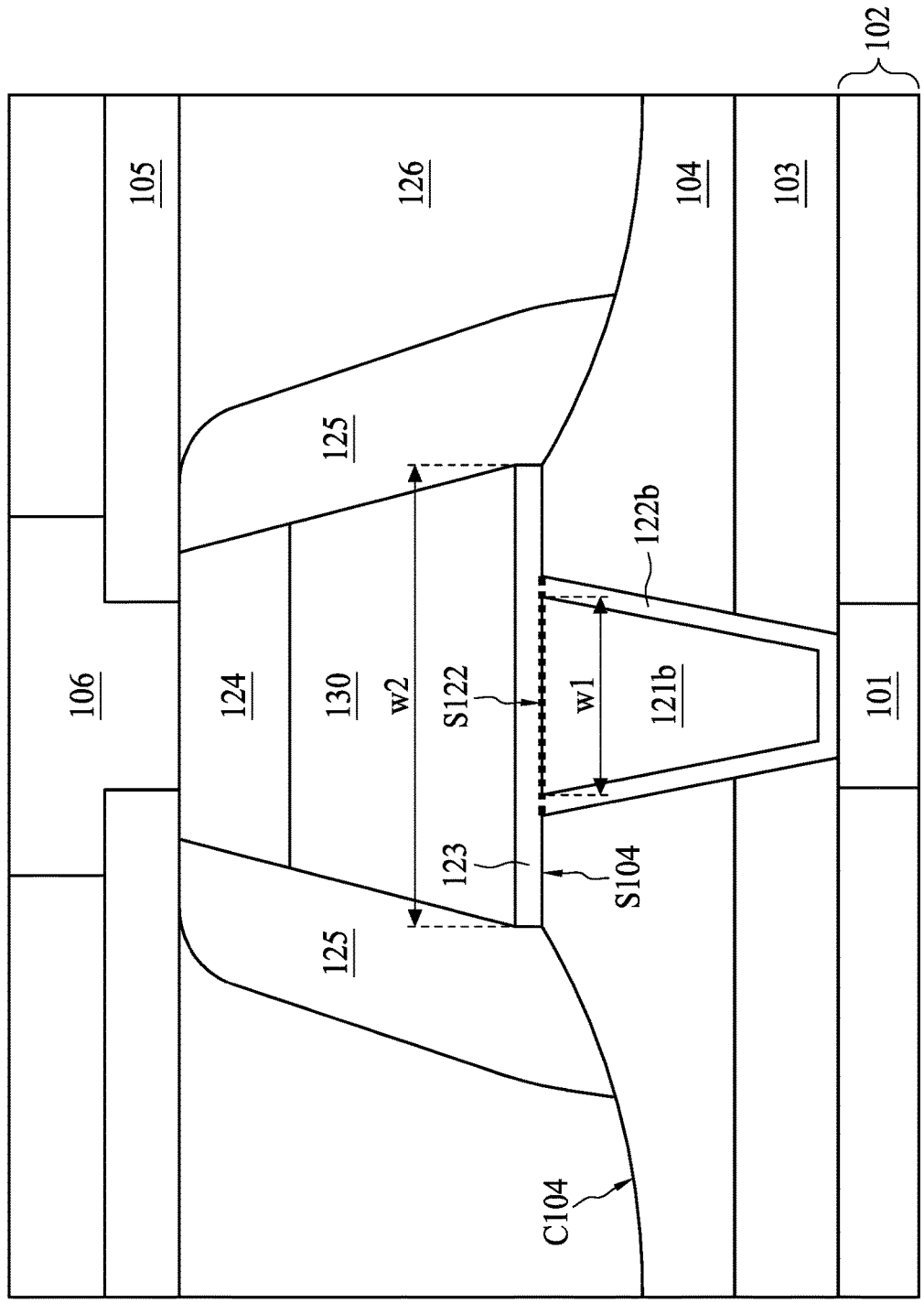

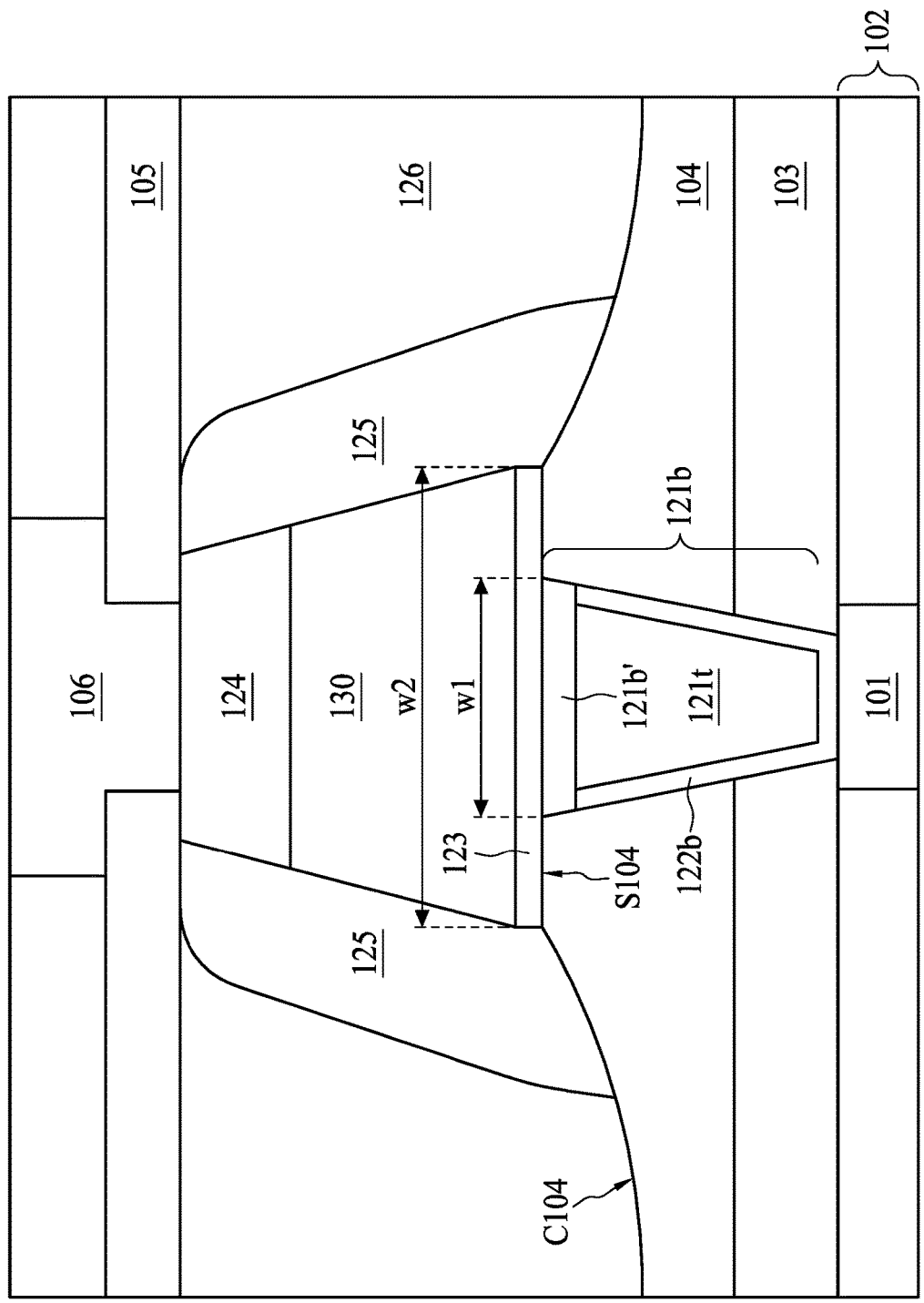

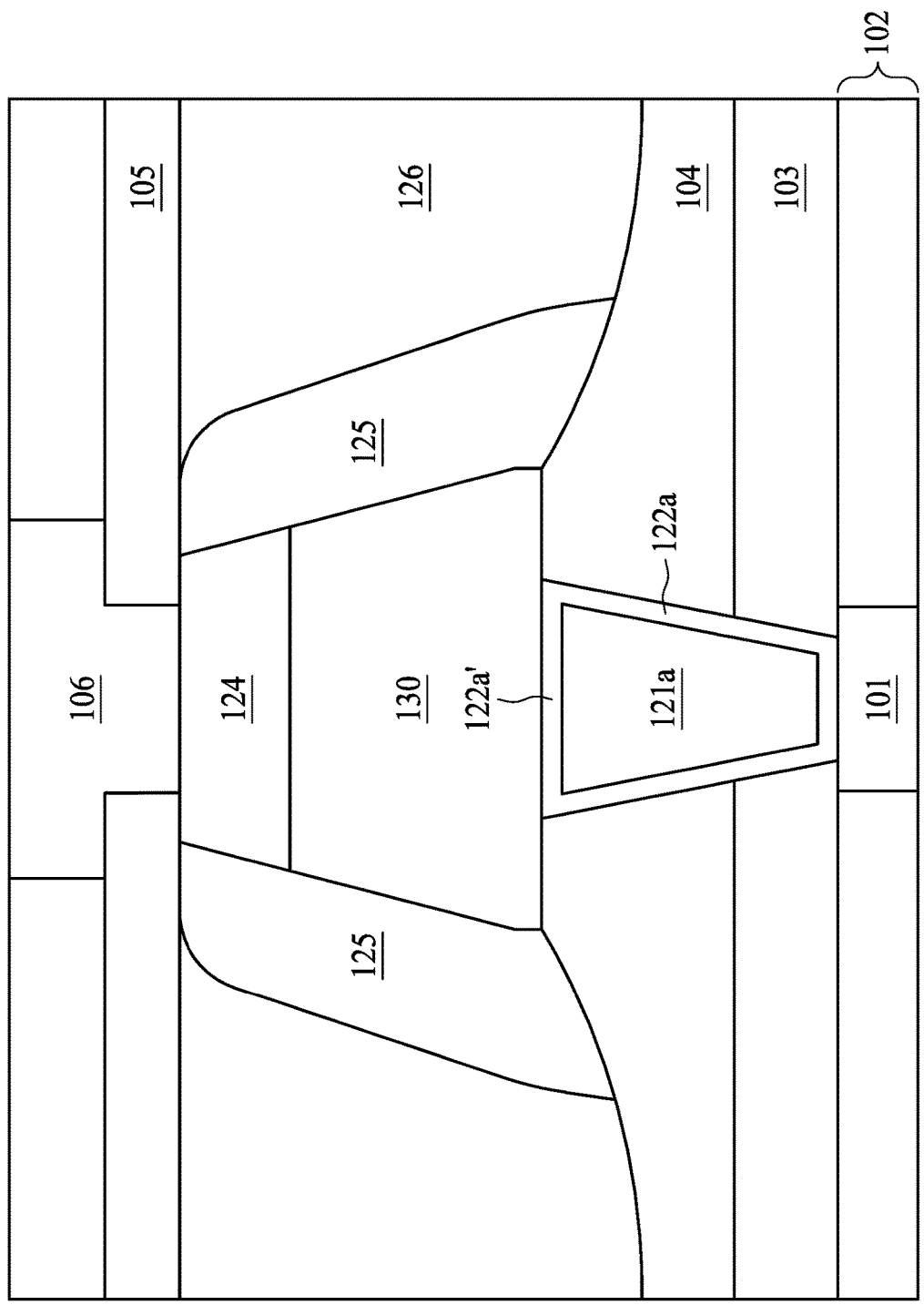

SEMICONDUCTOR STRUCTURE AND MANUFACTURING METHOD OF THE SAME

CROSS REFERENCE TO RELATED APPLICATIONS

This application claims the benefit of prior-filed provisional application No. 62/711,803, filed Jul. 30, 2018.

BACKGROUND

Semiconductors are used in integrated circuits for electronic applications, including radios, televisions, cell phones, and personal computing devices. One type of well-known semiconductor device is the semiconductor storage device, such as dynamic random access memories (DRAMs), or flash memories, both of which use charges to store information.

A more recent development in semiconductor memory devices involves spin electronics, which combines semiconductor technology and magnetic materials and devices. The spin polarization of electrons, rather than the charge of the electrons, is used to indicate the state of "1" or "0." One such spin electronic device is a spin torque transfer (STT) magnetic tunneling junction (MTJ) device MTJ device includes free layer, tunnel layer, and pinned layer. The magnetization direction of free layer can be reversed by applying a current through tunnel layer, which causes the injected polarized electrons within free layer to exert so-called spin torques on the magnetization of free layer. Pinned layer has a fixed magnetization direction. When current flows in the direction from free layer to pinned layer, electrons flow in a reverse direction, that is, from pinned layer to free layer. The electrons are polarized to the same magnetization direction of pinned layer after passing pinned layer; flowing through tunnel layer; and then into and accumulating in free layer. Eventually, the magnetization of free layer is parallel to that of pinned layer, and MTJ device will be at a low resistance state. The electron injection caused by current is referred to as a major injection.

When current flowing from pinned layer to free layer is applied, electrons flow in the direction from free layer to pinned layer. The electrons having the same polarization as the magnetization direction of pinned layer are able to flow through tunnel layer and into pinned layer. Conversely, electrons with polarization differing from the magnetization of pinned layer will be reflected (blocked) by pinned layer and will accumulate in free layer. Eventually, magnetization of free layer becomes anti-parallel to that of pinned layer, and MTJ device will be at a high resistance state. The respective electron injection caused by current is referred to as a minor injection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a cross section of a semiconductor structure, in accordance with some embodiments of the present disclosure.

FIG. 3C is a cross section of a semiconductor structure, in accordance with some embodiments of the present disclosure.

FIG. 11A to FIG. 11F are cross sections of a semiconductor structure during intermediate stages of manufacturing operations, in accordance with some embodiments of the present disclosure.

DETAILED DESCRIPTION

Figure 1:
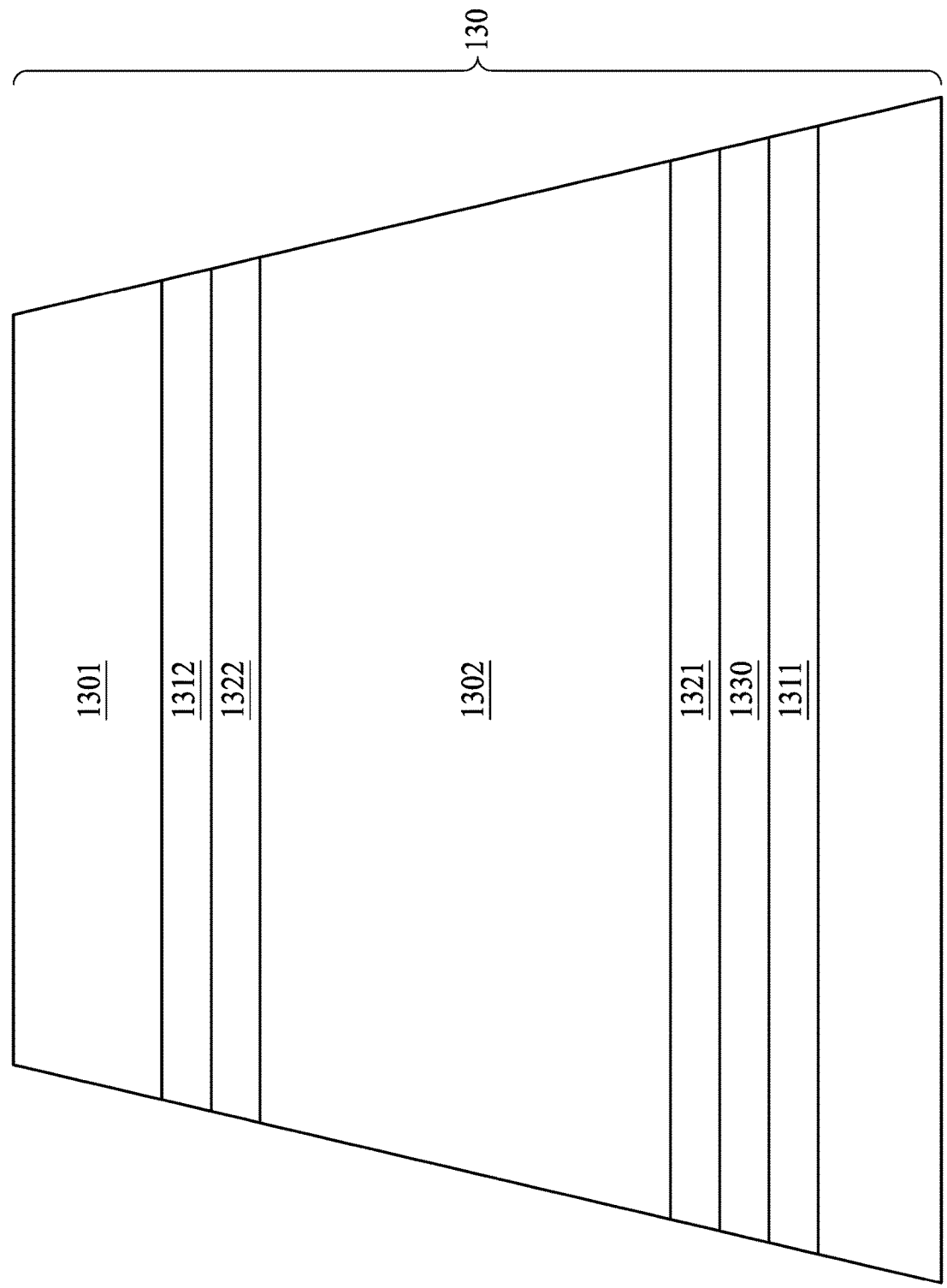
FIG. 1 is a cross section of a magnetic tunneling junction (MTJ), in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A magnetic tunneling junction (MTJ) over a substrate can be formed by patterning a MTJ layer over a substrate, and subsequently performing an etching operation, such as ion beam etching. Conventionally, a critical dimension of a bottom of a conventional MTJ is narrower than a critical dimension of a bottom electrode via under the MTJ layer. However, during the operation of etching the MTJ layer, a material of the bottom electrode via and/or a material of a barrier layer surrounding the bottom electrode via may be sputtered and deposited on a sidewall of the patterned MTJ. The bottom electrode via and/or the barrier layer may include tantalum (Ta) or tantalum derivatives such as tantalum nitride (TaN), whereby device short may be induced by tantalum-containing residues deposited on a sidewall of a patterned MTJ. Specifically, tantalum-containing residues may form a conductive path on a sidewall of a tunnel barrier layer of the patterned MTJ as the electric and magnetic properties of the MTJ may not be effectively controlled by tunneling effect.

Tantalum (Ta), tantalum nitride (TaN), or other tantalum derivatives has a relatively higher sticking coefficient over the sidewall of the MTJ, thus it may be difficult to effectively remove such residues by cleaning, etching, or similar operations without substantially affecting the properties of the MTJ or adjacent structures. The present disclosure provides semiconductor structures and the fabrication methods thereof, wherein a critical dimension of a bottom of an MTJ is greater than a critical dimension of a bottom electrode via under the MTJ layer. Thereby the risk of the tantalum-containing material from the bottom electrode via and/or a barrier layer surrounding the bottom electrode via may be lowered. The risk of device short induced by tantalum-containing residue may also be alleviated by replacing the materials of the bottom electrode via, the barrier layer, or a material of the MTJ. In addition, reducing duration of MTJ etching operation may also lower the risk of device short.

Referring to FIG. 1, FIG. 1 is a cross section of a magnetic tunneling junction (MTJ) 130, in accordance with some embodiments of the present disclosure. The MTJ 130 may include a first tunnel barrier layer 1321, a resistance switching element 1302 over the first tunnel barrier layer 1321, a capping layer 1312 over the resistance switching element 1302, and a top spacer 1301 over the capping layer 1312. Optionally, the MTJ 130 may further include a seed layer 1311 below the first tunnel barrier layer 1321, and/or a second tunneling barrier 1322 between the capping layer 1312 and the resistance switching element 1302. In some embodiments, a pinned layer 1330 is further disposed between the seed layer 1311 and the first tunnel barrier layer 1321. The spin polarization of electrons is determined by the relationship of orientation between the resistance switching element 1302 and the pinned layer 1330, wherein the orientation of the resistance switching element 1302 and the pinned layer 1330 can be same or different.

The first tunnel barrier layer 1321 allows electrons to be able to tunnel through the tunnel barrier layer when an adequate bias voltage is applied. In some embodiments, the tunnel barrier layer may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). A material of the second tunneling barrier 1322 may be similar to the first tunnel barrier layer 1321. In some embodiments, second tunneling barrier 1322 may improve the control of tunneling effect. However, in some other embodiments, the second tunneling barrier 1322 may be omitted to reduce the risk of device short due to residues deposited on a sidewall of the second tunneling barrier 1322.

The capping layer 1312 may include metal. For example the capping layer 1312 can be a multi-layer metal, a thin metal-oxide, or a metal-nitride layer. The metal in the capping layer may include tantalum (Ta), tantalum nitride (TaN), or tantalum derivatives. However in some embodiments, in order to further lower the risk of sputtering tantalum-containing residue from the capping layer 1312 during fabrication, the capping layer 1312 is free of tantalum. For example, the capping layer 1312 may include ruthenium (Ru), beryllium (Be), magnesium (Mg), aluminum (Al), titanium (Ti), tungsten (W), germanium (Ge), platinum (Pt), their alloy thereof, or the like.

The seed layer 1311 may ameliorate the forming of the MTJ 130 by virtue of lattice orientation. The first tunnel barrier layer 1321, the pinned layer 1330, and the resistance switching element 1302 may follow the crystal orientation of the seed layer 1311. In some embodiments when a resistance switching element 1302 of MTJ 130 is preferred to have a (001) crystal orientation for device performance concern, the first tunnel barrier layer 1321 may possess a (001) surface. For example, if the resistance switching element 1302 is formed on a first tunnel barrier layer 1321 having magnesium oxide (MgO), the seed layer 1311 may include a body-centered cubic (BCC) structure such as nickel (Ni), chromium (Cr), tantalum (Ta), cobalt-iron-boron (CoFeB), cobalt-iron-tantalum (CoFeTa), cobalt-iron-tungsten (CoFeW), cobalt-iron-boron-tungsten (CoFeBW), or an amouphous material such as tantalum nitride (TaN); thence the resistance switching element 1302 may substantially have a crystal orientation of (001) or similar to (001). However in some embodiments, in order to further lower the risk of sputtering tantalum-containing residue from the seed layer 1311 during fabrication, the seed layer 1311 is free of tantalum or tantalum derivatives. In some other embodiments, the seed layer 1311 can be omitted if the MTJ 130 can be formed with desired crystal orientation without the aid of the seed layer 1311, then a total thickness of the MTJ 130 may be reduced. Total thickness reduction of the MTJ 130 may further reduce the ion beam etching duration when patterning to form the MTJ cell, thereby lowering the risk of sputtering residue contamination at the sidewall of MTJ cell.

Figure 2A:
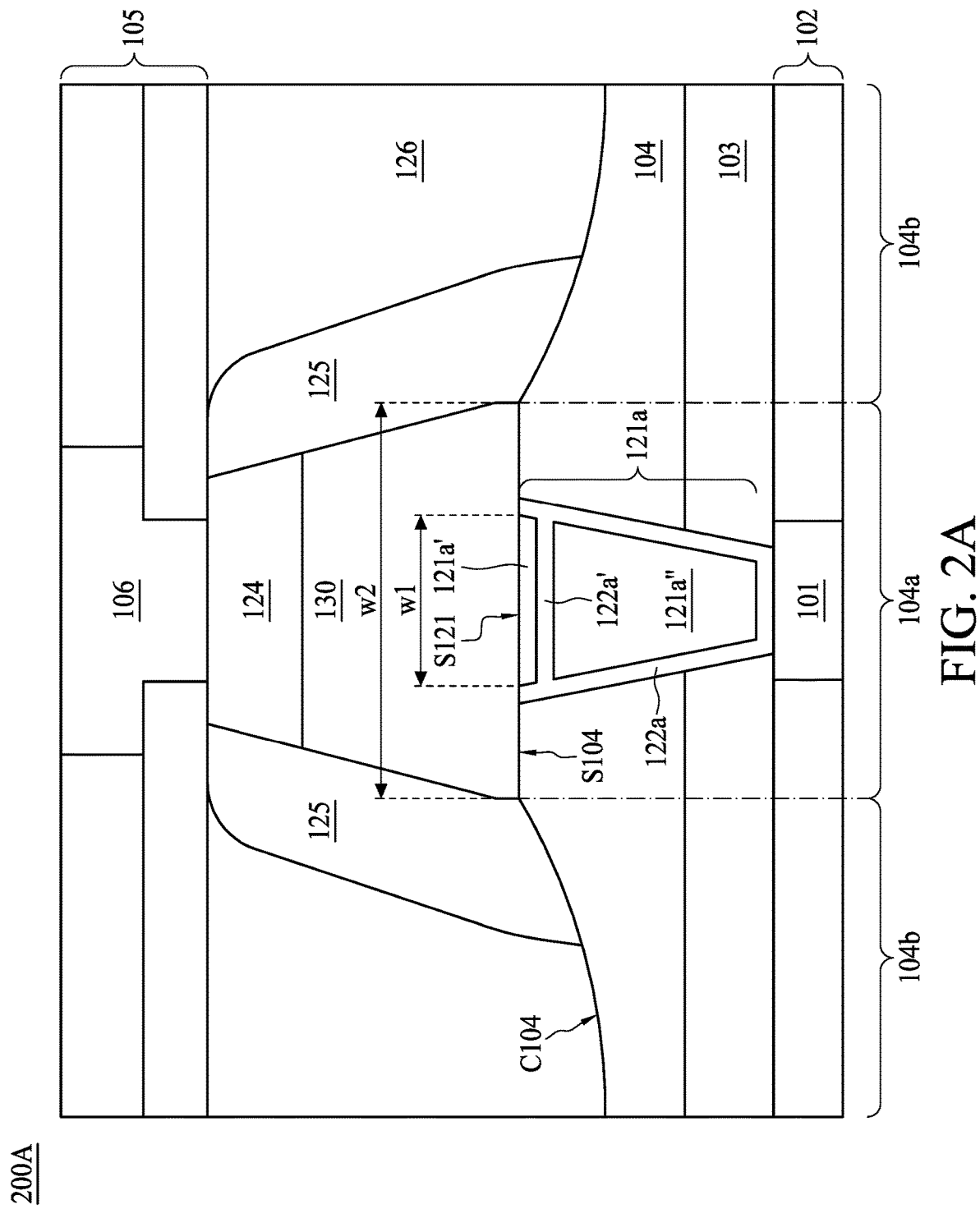
FIG. 2A is a cross section of a semiconductor structure, in accordance with some embodiments of the present disclosure.

Referring to FIG. 2A, FIG. 2A is a cross section of a semiconductor structure 200A, in accordance with some embodiments of the present disclosure. The semiconductor structure 200A includes a bottom electrode via 121*a*, a barrier layer 122*a*, an oxide layer 104, and the MTJ 130 as described in FIG. 1. The semiconductor structure 200A may further include an N$^{th}$ metal layer 102, an N$^{th}$ metal line 101 in the N$^{th}$ metal layer 102, a top electrode 124, a sidewall spacer 125, a dielectric layer 126, an (N+1)$^{th}$ metal layer 105, and a contact 106. Note that hereinafter elements in FIG. 2B to FIG. 17H being the same as or similar to aforesaid counterparts in FIG. 2A are denoted by the same reference numerals, as duplicated explanations are omitted.

The bottom electrode via 121*a* is above the N$^{th}$ metal layer 102 and being electrically connected to the N$^{th}$ metal line 101. The barrier layer 122*a* at least laterally surrounds a sidewall of the bottom electrode via 121*a*, as the barrier layer 122*a* may further space between the N$^{th}$ metal line 101 and the bottom electrode via 121*a*. The bottom electrode via 121*a* and the barrier layer 122*a* are laterally surrounded by the oxide layer 104, as a top surface S121 of the bottom electrode via 121*a* is substantially coplanar with a top surface S104 of the oxide layer 104. The oxide layer 104 under the top surface S104 is denoted as a first portion 104*a*. The first portion 104*a* of the oxide layer 104 is surrounded by a second portion 104*b* of the of the oxide layer 104, wherein a top surface C104 of the second portion 104*b* is lower than the top surface S104 of the first portion 104*a*. The top surface C104 of the oxide layer 104 is concaved toward the N$^{th}$ metal layer 102. The MTJ 130 is above the bottom electrode via 121*a*, as a bottom surface of the MTJ 130 contacts with the top surface S121 of the bottom electrode via 121*a* and the top surface S104 of the oxide layer 104. In some embodiments, the top surface S104 of the oxide layer 104 may be coplanar with a top surface of the barrier layer 122*a*. A top surface of the bottom electrode via 121*a* has a first width w1 and a bottom surface of the MTJ 130 has a second width w2 at the bottom greater than the first width w1. The MTJ 130 may have a shape tapering away from the bottom electrode via 121*a*.

The barrier layer 122*a* laterally surrounds the bottom electrode via 121*a*. In addition, the barrier layer 122*a* may further include an interlayer portion 122*a*' that separate the bottom electrode via 121*a* into an upper portion 121*a*' and a lower portion 121*a*''. The upper portion 121*a*' of the bottom electrode via 121*a* tapers away from the MTJ 130. The top surface S121 of the upper portion 121*a*' is in contact with a bottom surface of the MTJ 130. It is noteworthy that the upper portion 121*a*' is also laterally surrounded by the barrier layer 122*a*.

In some embodiments, the bottom electrode via 121*a* may include titanium nitride (TiN), copper (Cu), cobalt (Co), tungsten (W), or other suitable materials. In such cases, the barrier layer 122*a* may include tantalum, such as tantalum (Ta), tantalum nitride (TaN), tantalum derivatives, or the like. The barrier layer 122*a* having tantalum may serve as a diffusion barrier to impede titanium nitride from being diffused into the MTJ 130 due to elevated temperature, wherein such diffusion may induce thermal degradation. The barrier layer 122*a* may also ameliorate adhesion between the bottom electrode via 121*a* and the oxide layer 104. Furthermore, if the titanium nitride is formed to possess a lattice structure with a dominate crystal orientation, which is not ideal for subsequent MTJ 130 formation (for example, non-(001) orientations), the interlayer portion 122*a*' of the barrier layer 122*a* including tantalum or tantalum nitride could then interrupt the lattice structure with the dominate crystal orientation and provide an amorphous surface for subsequent MTJ 130 formation. It is noteworthy that the upper portion 121*a*' may or may not have a material identical to the bottom electrode via 121*a*. A material of the upper portion 121*a*' may include titanium nitride (TiN), copper (Cu), cobalt (Co), tungsten (W), or other suitable materials.

In some embodiments, when the TiN filling the bottom electrode via 121*a* is conducted by chemical vapor deposition (CVD) under conditions that favor the growth of amorphous TiN, the interlayer portion 122*a*' of the barrier layer 122*a* may be omitted because the lattice structure of such amorphous TiN cast negligible effect to subsequent MTJ 130 formation.

The top electrode 124 is over a top surface of the MTJ 130. The MTJ 130 and top electrode 124 are laterally surrounded by a sidewall spacer 125, wherein the sidewall spacer 125 may include silicon nitride (SiN), silicon carbide (SiC), silicon oxynitride (SiON), silicon oxycarbide (SiOC), the combinations thereof, or any suitable materials which can be used as a protection layer. In some embodiments, the sidewall spacer 125 contacts with the top surface C104 of the oxide layer 104. The (N+1)$^{th}$ metal layer 105 and the contact 106 is above the top electrode 124, wherein the top electrode 124 is electrically connected to the contact 106. The dielectric layer 126 surrounds the sidewall spacer 125, and spaces between the (N+1)$^{th}$ metal layer 105 and the oxide layer 104. In some embodiments, the N$^{th}$ metal layer 102 and the (N+1)$^{th}$ metal layer 105 may include copper (Cu).

The semiconductor structure 200A (as well as the other semiconductor structures discussed hereinafter) may selectively include an etch stop layer 103 between the oxide layer 104 and the N$^{th}$ metal layer 102, wherein the etch stop layer 103 can include single layer structure or multi-layer structure.

Figure 2B:
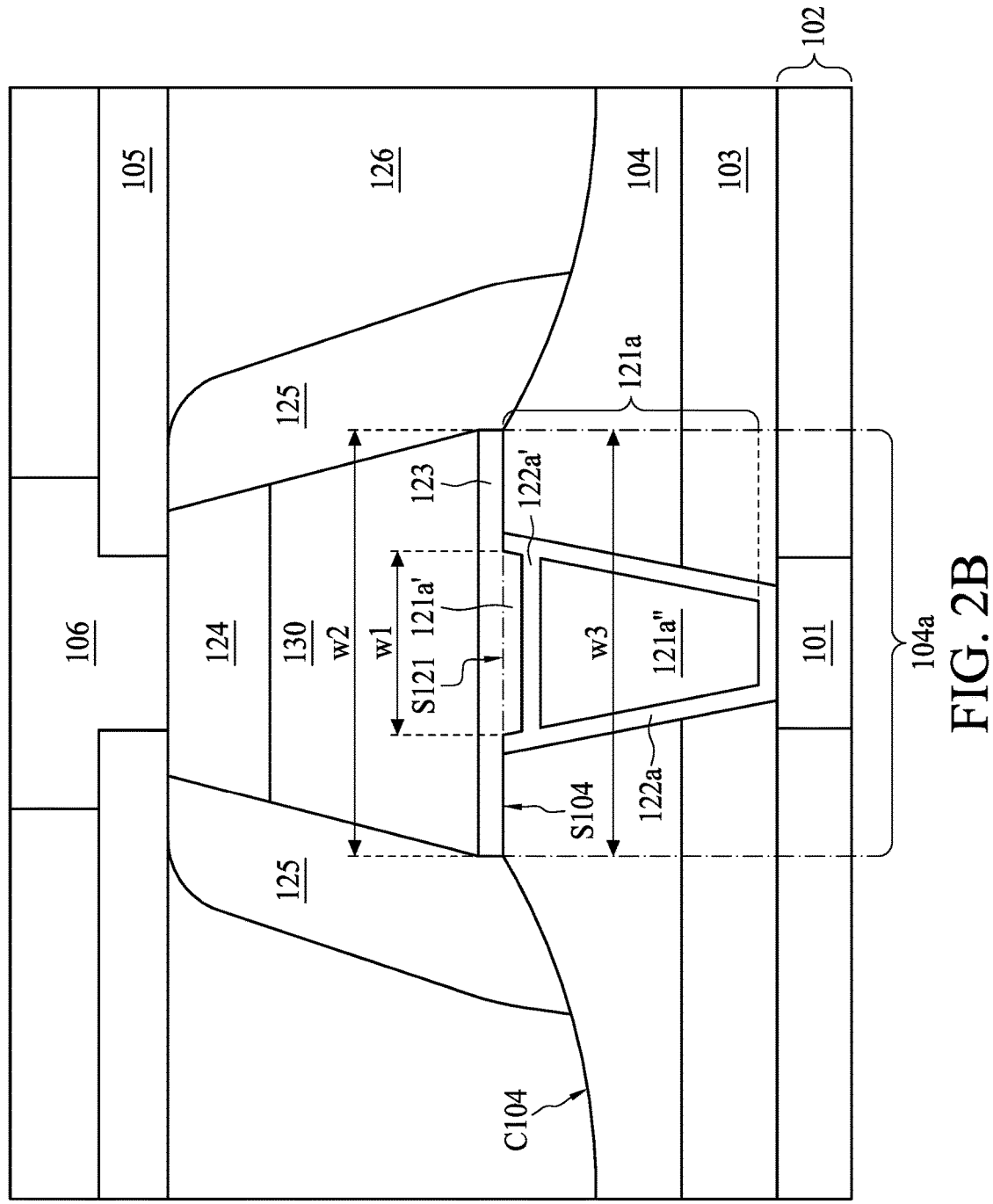
FIG. 2B is a cross section of a semiconductor structure, in accordance with some embodiments of the present disclosure.

Referring to FIG. 2B, FIG. 2B is a cross section of a semiconductor structure 200B, in accordance with some embodiments of the present disclosure. The semiconductor structure 200B further includes a bottom electrode 123 between the MTJ 130 and the top surface S121 of the bottom electrode via 121a. The bottom electrode 123 contacts with the upper portion 121a' of the bottom electrode via 121a and the top surface S104 of the oxide layer 104. The top surface S104 of the oxide layer 104 is substantially coplanar with the top surface S121 of the bottom electrode via 121a, and the first portion 104a of the oxide layer 104 is under the bottom electrode 123. A bottom surface of the bottom electrode 123 has a third width w3 greater than the first width w1. In some embodiments, the third width w3 may be identical with the second width w2 of the bottom surface of the MTJ 130. In some embodiments, the bottom electrode 123 includes titanium nitride (TiN).

Figure 2C:
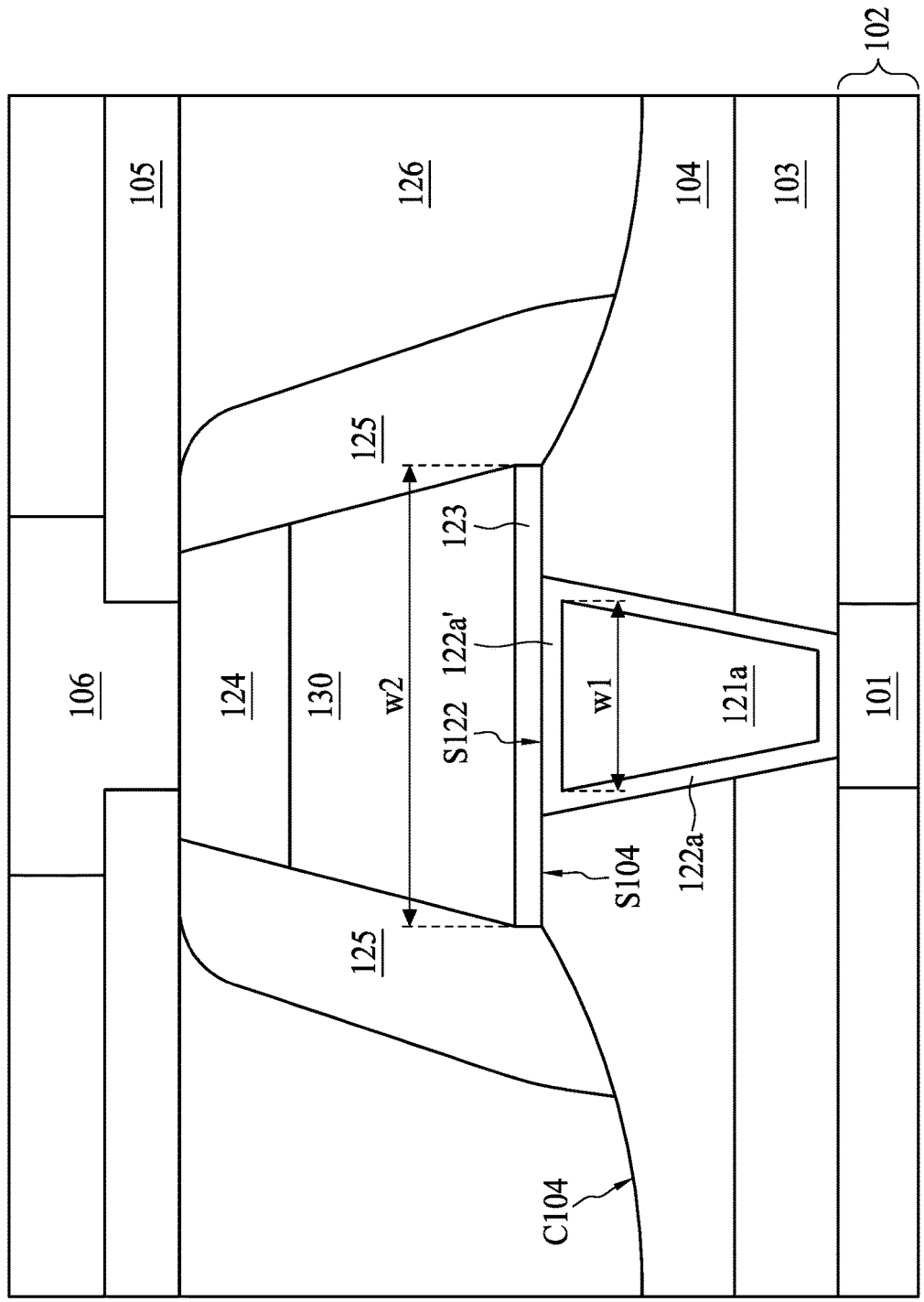
FIG. 2C is a cross section of a semiconductor structure, in accordance with some embodiments of the present disclosure.

Referring to FIG. 2C, FIG. 2C is a cross section of a semiconductor structure 200C, in accordance with some embodiments of the present disclosure. The semiconductor structure 200C does not include the upper portion 121a' of the bottom electrode via 121a. The interlayer portion 122a' of the barrier layer 122a contacts with the bottom surface of the bottom electrode 123 and the bottom electrode via 121a. A top surface S122 of the barrier layer 122a is substantially coplanar with the top surface S104 of the oxide layer 104.

Figure 3A:
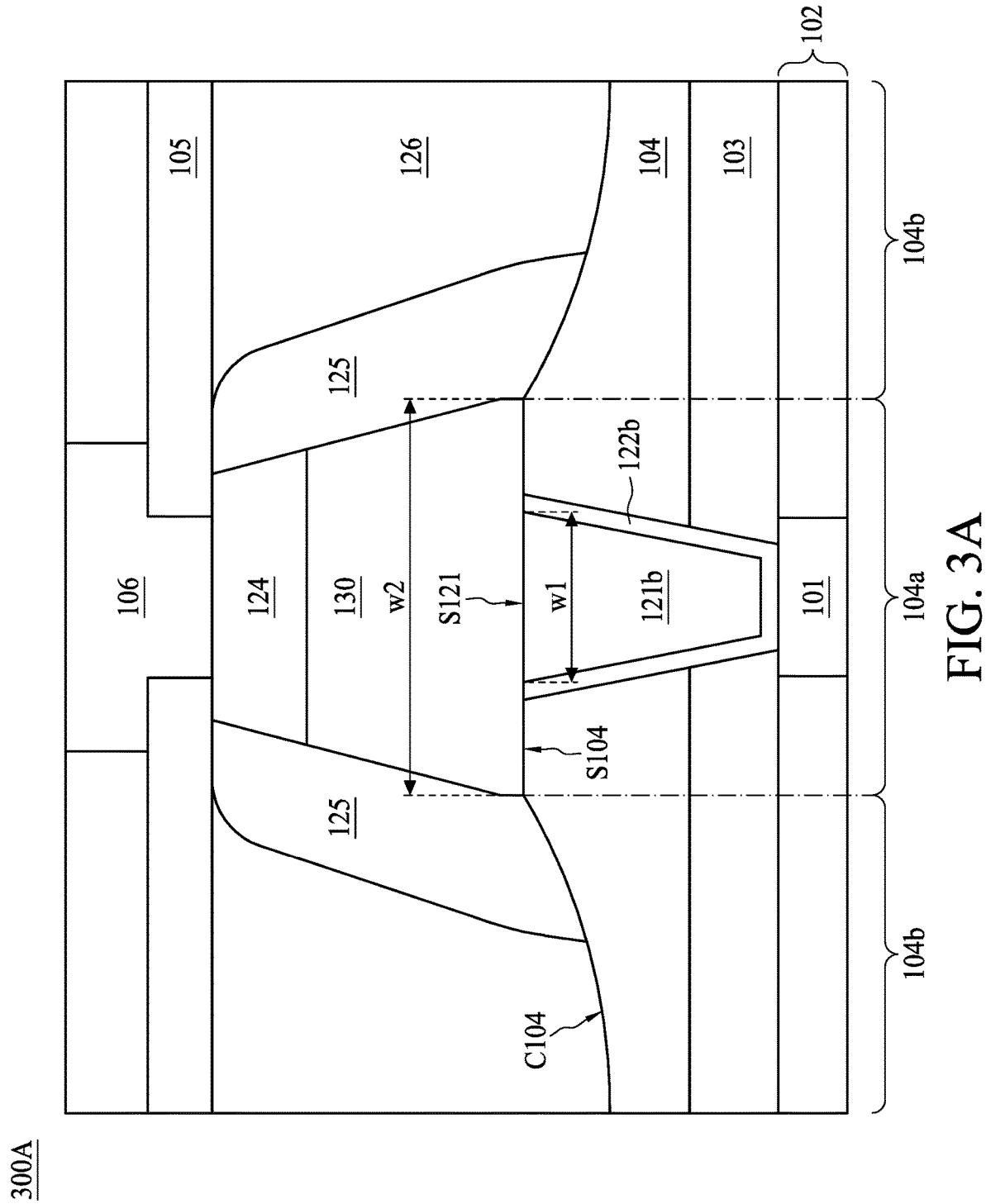
FIG. 3A is a cross section of a semiconductor structure, in accordance with some embodiments of the present disclosure.

Referring to FIG. 3A, FIG. 3A is a cross section of a semiconductor structure 300A, in accordance with some embodiments of the present disclosure. The bottom electrode via 121b is above the $N^{th}$ metal layer 102 and being electrically connected to the $N^{th}$ metal line 101. The barrier layer 122b at least laterally surrounds a sidewall of the bottom electrode via 121b. The barrier layer 122b may further space between the $N^{th}$ metal line 101 and the bottom electrode via 121a. The bottom electrode via 121b and the barrier layer 122b are laterally surrounded by the oxide layer 104. In some embodiments, a top surface S121 of the bottom electrode via 121b is substantially coplanar with a top surface S104 of the oxide layer 104, wherein the oxide layer 104 under the top surface S104 is denoted as a first portion 104a.

The first portion 104a of the oxide layer 104 is surrounded by a second portion 104b of the of the oxide layer 104, wherein a top surface C104 of the second portion 104b is lower than the top surface S104 of the first portion 104a. The top surface C104 of the oxide layer 104 is concaved toward the $N^{th}$ metal layer 102. The MTJ 130 is above the bottom electrode via 121b, as the bottom surface of the MTJ 130 contacts with the top surface S121 of the bottom electrode via 121b and the top surface S104 of the oxide layer 104. In some embodiments, the top surface S104 of the oxide layer 104 may be coplanar with a top surface of the barrier layer 122b. A top surface of the bottom electrode via 121b has a first width w1 and a bottom surface of the MTJ 130 has a second width w2 at the bottom greater than the first width w1. The MTJ 130 may have a shape tapering away from the bottom electrode via 121b.

In some embodiments, the bottom electrode via 121b may include tungsten (W). In such cases, the barrier layer 122b may include titanium nitride (TiN), or the like. The barrier layer 122a having titanium nitride may serve as a diffusion barrier to impede tungsten from outward diffusion. The barrier layer 122b may also ameliorate adhesion between the bottom electrode via 121a and the oxide layer 104.

In some other embodiments, the top surface S121 of the bottom electrode via 121b may be lower than the top surface S104 of the oxide layer 104 as the barrier layer 122b covers the top surface S121 the top surface S121 and contacts with the MTJ 130.

Referring to FIG. 3B, FIG. 3B is a cross section of a semiconductor structure 300B, in accordance with some embodiments of the present disclosure. The semiconductor structure 300B further includes a bottom electrode 123 between the MTJ 130 and the top surface S121 of the bottom electrode via 121b. The bottom electrode 123 contacts with the bottom electrode via 121b and the top surface S104 of the oxide layer 104. The top surface S104 of the oxide layer 104 is substantially coplanar with the top surface S121 of the bottom electrode via 121b, and the first portion 104a of the oxide layer 104 is under the bottom electrode 123. A bottom surface of the bottom electrode 123 has a third width w3 greater than the first width w1. In some embodiments, the third width w3 may be identical with the second width w2 of the bottom surface of the MTJ 130. In some embodiments, the bottom electrode 123 includes titanium nitride. In some embodiments, the bottom electrode 123 is formed by an operation, for example forming a titanium nitride layer by chemical vapor deposition (CVD), that creates an amorphous surface for subsequent MTJ 130 formation.

Referring to FIG. 3C, FIG. 3C is a cross section of a semiconductor structure 300C, in accordance with some embodiments of the present disclosure. The bottom electrode via 121b of the semiconductor structure 300C further includes an amorphous cap 121b', which may or may not be composed of Ta or TaN, above a tungsten portion 121t of the bottom electrode via 121b. In some embodiments, the bottom electrode 123 between the MTJ 130 and the bottom electrode via 121b is further present in the semiconductor structure 300C. In some other embodiments, the bottom electrode 123 is omitted in the semiconductor structure 300C.

Figure 4:
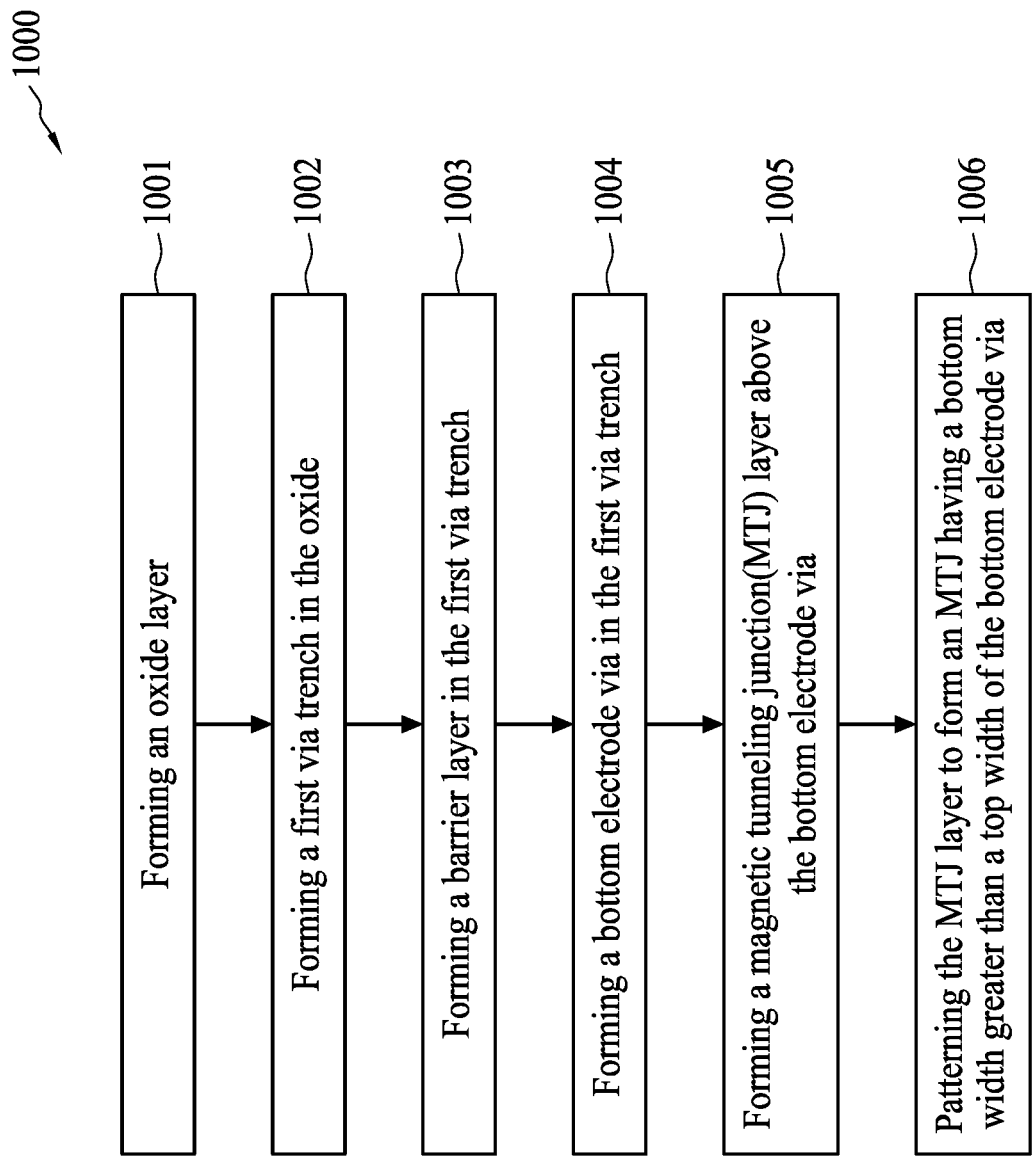
FIG. 4 shows a flow chart representing method for fabricating a semiconductor structure, in accordance with some embodiments of the present disclosure.

Referring to FIG. 4, FIG. 4 shows a flow chart representing method for fabricating a semiconductor structure, in accordance with some embodiments of the present disclosure. The method for fabricating a semiconductor structure may include forming an oxide layer (operation 1001), forming a first via trench in the oxide layer (operation 1002), forming a barrier layer in the first via trench (operation 1003), forming a bottom electrode via in the first via trench (operation 1004), forming an MTJ layer above the bottom electrode via (operation 1005), and patterning the MTJ layer to form an MTJ having a bottom width greater than a top width of the bottom electrode via (operation 1006).

Figure 5:
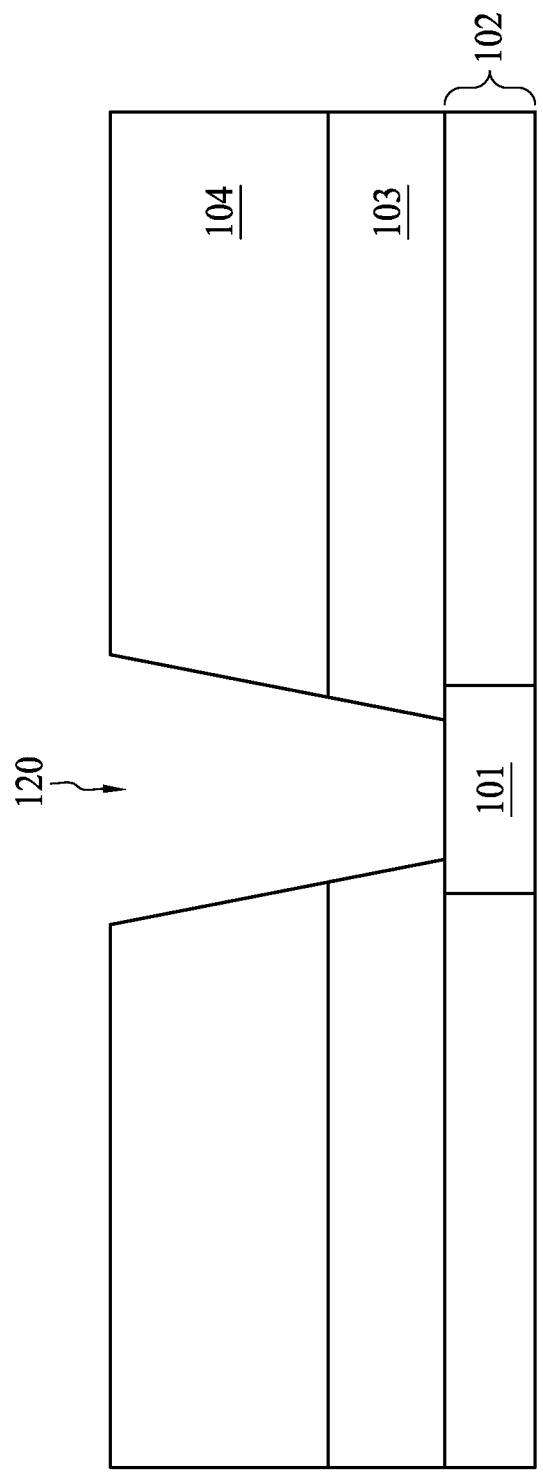
FIG. 5 to FIG. 7 are cross sections of a semiconductor structure during intermediate stages of manufacturing operations, in accordance with some embodiments of the present disclosure.
Figure 6:
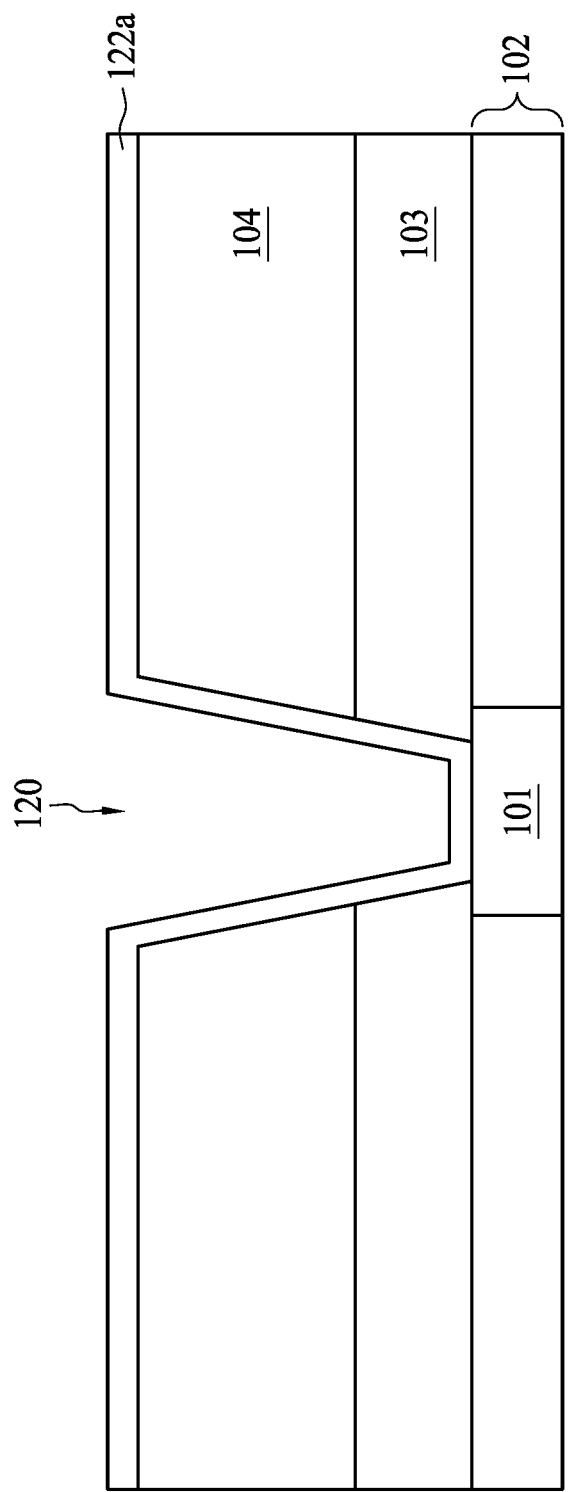
Figure 7:
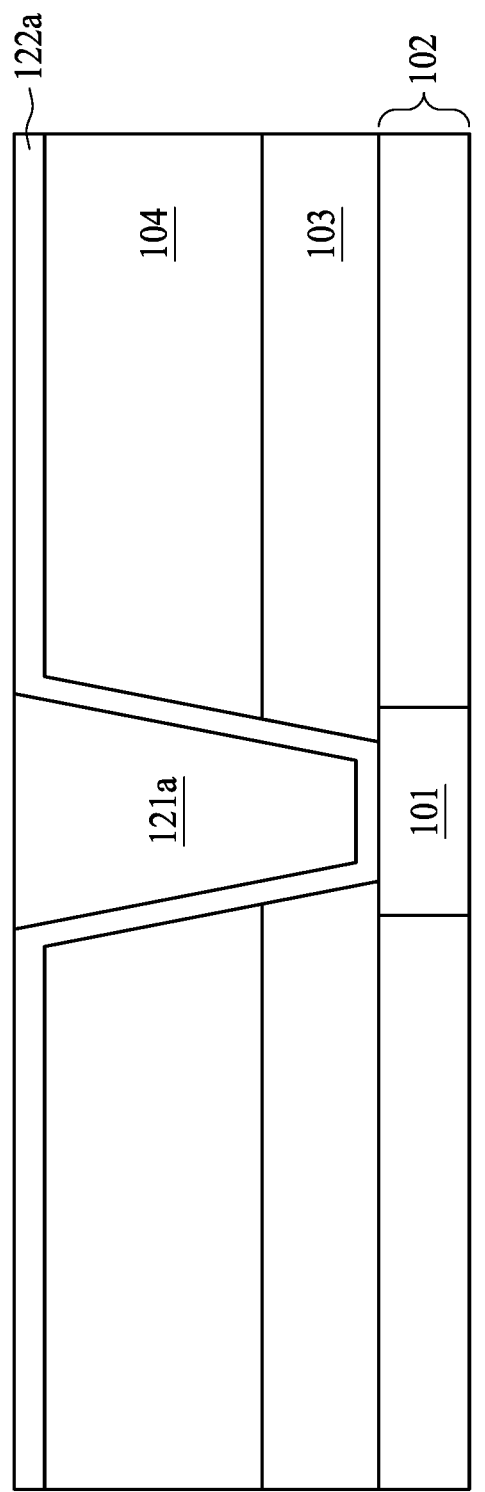

Hereinafter FIG. 5 to FIG. 7 are cross sections of the semiconductor structure 200A, the semiconductor structure 200B, or the semiconductor structure 200C during intermediate stages of manufacturing operations, in accordance with some embodiments of the present disclosure.

Referring to FIG. 5, FIG. 5 is a cross section of a semiconductor structure during intermediate stages of manufacturing operations, in accordance with some embodiments of the present disclosure. The $N^{th}$ metal layer 102 and the $N^{th}$ metal line 101 in the $N^{th}$ metal layer 102 are formed. The oxide layer 104 is formed above the $N^{th}$ metal layer 102 (or above the etch stop layer 103 if the etch stop layer 103 is formed). In some embodiments, the oxide layer 104 may include tetraethoxysilane (TEOS), which can be formed by various deposition techniques. A first via trench 120 is subsequently formed in the oxide layer 104 and above the $N^{th}$ metal line 101. In some embodiments, the etch stop layer 103 is optionally formed above the $N^{th}$ metal layer 102 prior to forming the oxide layer 104, wherein the operation of etching the oxide layer 104 for forming the first via trench 120 can be controlled by the etch stop layer 103.

Referring to FIG. 6, FIG. 6 is a cross section of a semiconductor structure during intermediate stages of manufacturing operations, in accordance with some embodiments of the present disclosure. A barrier layer 122a is formed above the oxide layer 104, above the $N^{th}$ metal line 101, and conformably on a sidewall of the first via trench 120. The barrier layer 122a may include tantalum, such as tantalum (Ta), tantalum nitride (TaN), tantalum derivatives, or the like.

Referring to FIG. 6 and FIG. 7, FIG. 7 is a cross section of a semiconductor structure during intermediate stages of manufacturing operations, in accordance with some embodiments of the present disclosure. The bottom electrode via 121a is formed inside the first via trench 120, wherein the bottom electrode via 121a is laterally surrounded by the barrier layer 122a. In some embodiments, the bottom electrode via 121a may include titanium nitride (TiN). In some embodiments, the bottom electrode via 121a may be formed by chemical vapor deposition (CVD), physical vapor deposition (PVD), atomic layer deposition (ALD), or other suitable operations.

Hereinafter FIG. 8A to FIG. 8C and FIG. 9A to FIG. 9C are cross sections of the semiconductor structure 200A during intermediate stages of manufacturing operations, and FIG. 8A to FIG. 8C and FIG. 10A to FIG. 10E are cross sections of the semiconductor structure 200B during intermediate stages of manufacturing operations, in accordance with some embodiments of the present disclosure.

Figure 8A:
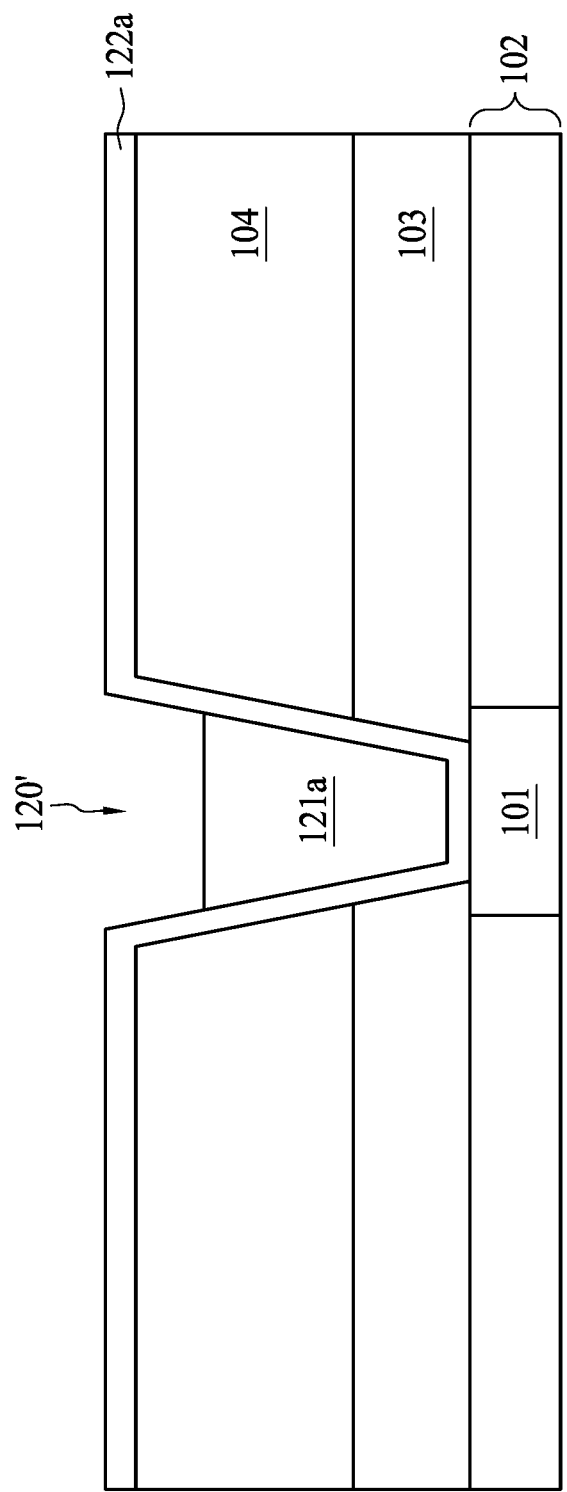
FIG. 8A to FIG. 8C are cross sections of a semiconductor structure during intermediate stages of manufacturing operations, in accordance with some embodiments of the present disclosure.

Referring to FIG. 8A, FIG. 8A is a cross section of a semiconductor structure during intermediate stages of manufacturing operations, in accordance with some embodiments of the present disclosure. Subsequent to the operations performed in FIG. 7, an etch operation, which may include dry etch operation and wet etch operation, are performed to remove a portion of the bottom electrode via 121a, thereby a second via trench 120' is formed. Herein a top surface of the etched bottom electrode via 121a is lower than a top surface of the barrier layer 122a. In some embodiments, the etching agent utilized herein may include halogen gas, such as chlorine gas ($Cl_2$).

Figure 8B:
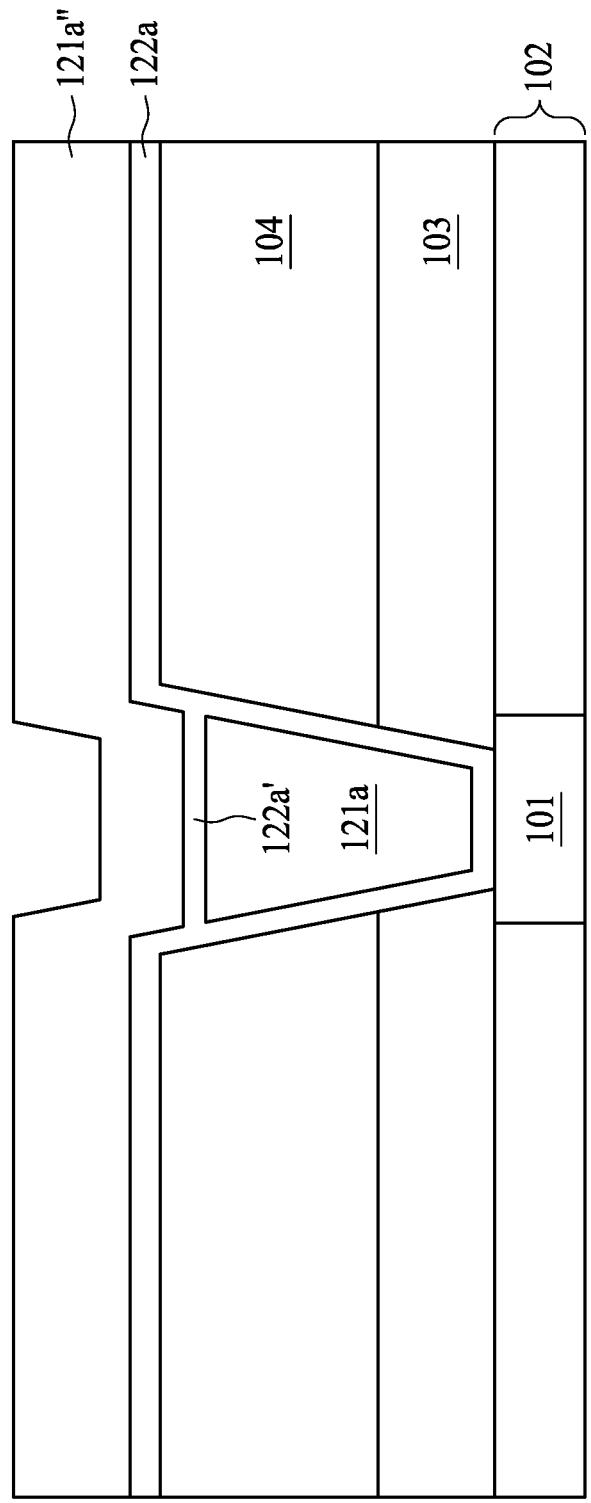

Referring to FIG. 8B, FIG. 8B is a cross section of a semiconductor structure during intermediate stages of manufacturing operations, in accordance with some embodiments of the present disclosure. The interlayer portion 122a' of the barrier layer 122a is formed above the top surface of the etched bottom electrode via 121a. A layer 121a" having the same material with the bottom electrode via 121a is formed above the barrier layer 122a and the interlayer portion 122a' of the barrier layer 122a. The layer 121a" may or may not have a material identical to the bottom electrode via 121a. A material of the layer 121a" may include titanium nitride (TiN), copper (Cu), cobalt (Co), tungsten (W), or other suitable materials.

Figure 8C:
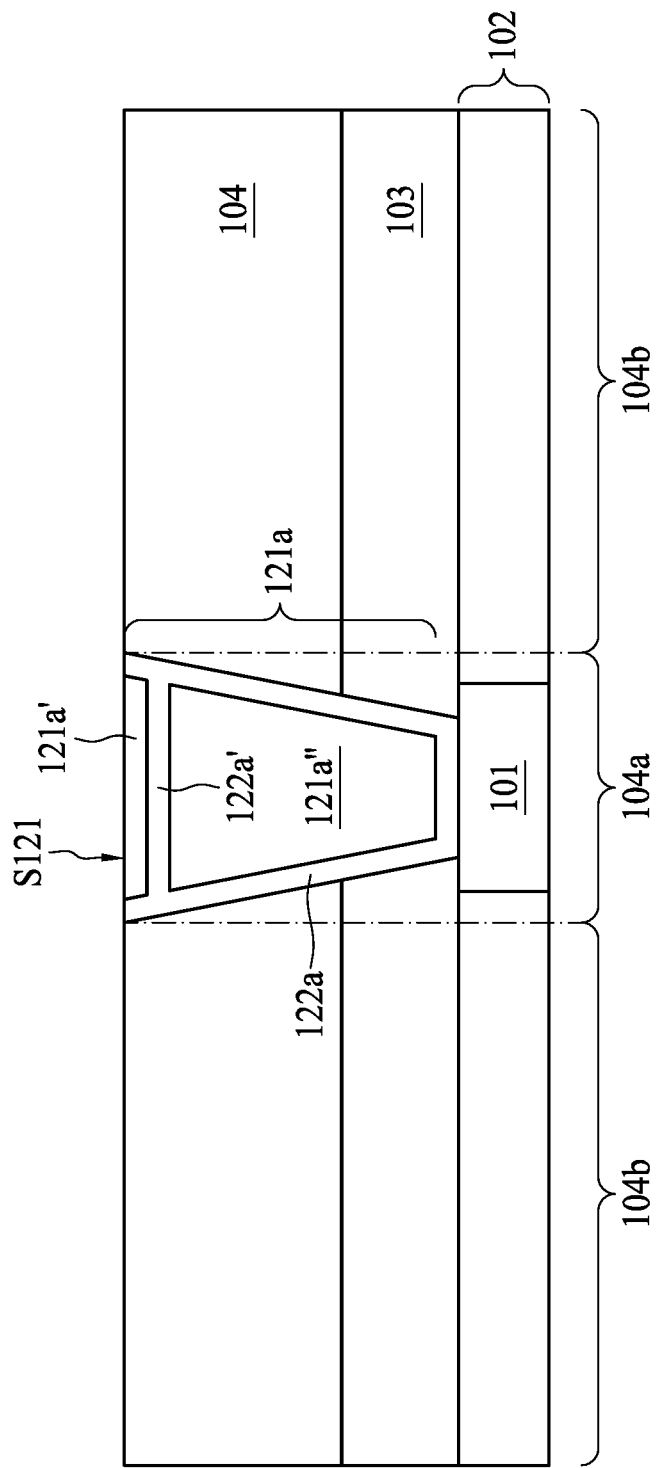

Referring to FIG. 8C, FIG. 8C is a cross section of a semiconductor structure during intermediate stages of manufacturing operations, in accordance with some embodiments of the present disclosure. A planarization operation (such as chemical mechanical planarization) is subsequently performed from above the layer 121a", as a top surface of the second portion 104b of the oxide layer 104 is exposed. The upper portion 121a' of the bottom electrode via 121a is thereby formed. The top surface S121 of the bottom electrode via 121a (which is identical with the top surface of the upper portion 121a') is substantially coplanar with the top surface of the second portion 104b of the oxide layer 104.

Figure 9A:
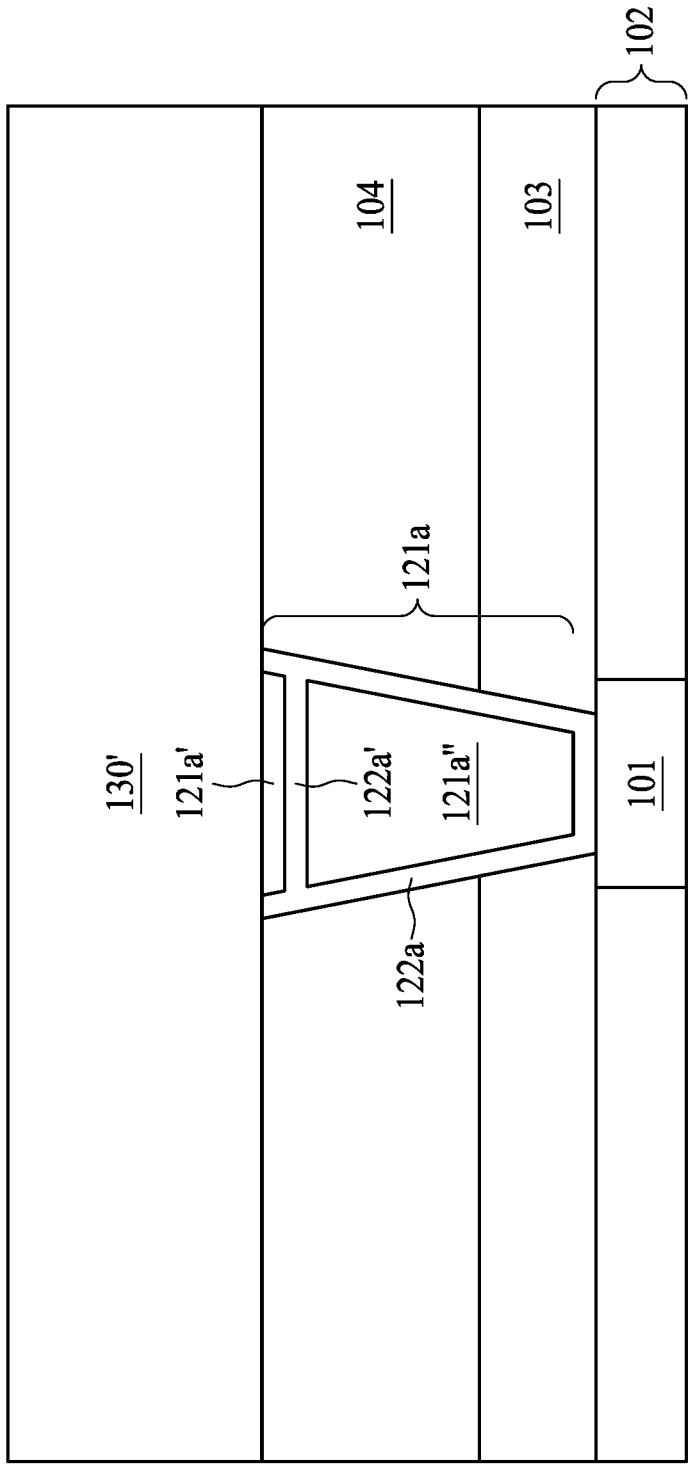
FIG. 9A to FIG. 9C are cross sections of a semiconductor structure during intermediate stages of manufacturing operations, in accordance with some embodiments of the present disclosure.

Referring to FIG. 1 and FIG. 9A, FIG. 9A is a cross section of the semiconductor structure 200A during intermediate stages of manufacturing operations, in accordance with some embodiments of the present disclosure. Subsequent to the operations performed in FIG. 8C, an MTJ layer 130' is formed above the oxide layer 104 and the bottom electrode via 121a. As previously discussed, MTJ layer 130' is preferred to be formed on a (001) lattice surface, or a surface similar to (001) lattice plane. The interlayer portion 122a' of the barrier layer 122a serving as a lattice interruptor may prevent the MTJ layer 130' from following the lattice orientation of the lower portion 121a" of the bottom electrode via 121a, e.g., titanium nitride, which has a non-(001) crystal orientation.

Figure 9B:
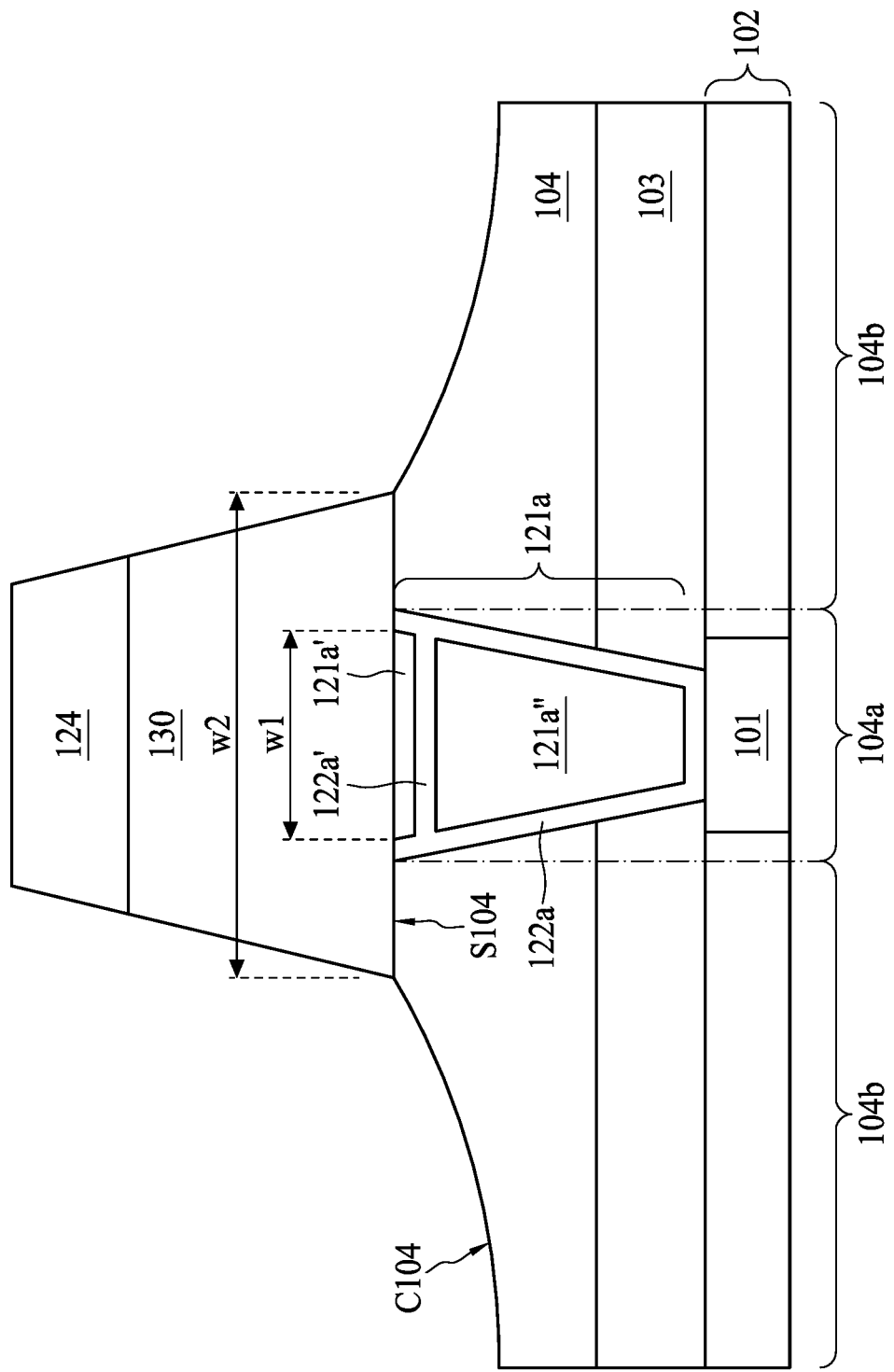

Referring to FIG. 9B, FIG. 9B is a cross section of the semiconductor structure 200A during intermediate stages of manufacturing operations, in accordance with some embodiments of the present disclosure. The top electrode 124 is subsequently formed above the MTJ layer 130', wherein the top electrode 124 can be used as a photomask. The MTJ layer 130' is patterned by the top electrode 124 to form the MTJ 130, wherein the MTJ 130 has the second width w2 greater than the first width w1 of the top surface of the bottom electrode via 121a, as the MTJ 130 may have a shape tapering away from the bottom electrode via 121a. The formation of the MTJ layer 130 may entail etching operation, such as ion beam etching (IBE) operation. The etching operation may remove a predetermined portion of the MTJ layer 130' and recess a portion of the oxide layer 104. Thereby the top surface C104 of the second portion 104b exposed from the top electrode 124 and/or the remaining MTJ 130 is lower than the top surface S104 of the first portion 104a, and the top surface C104 of the oxide layer 104 is concaved toward the $N^{th}$ metal layer 102.

In order to reduce the risk of sputtering tantalum-containing residues from the barrier layer 122a during the etching operation, the bottom width of the MTJ 130 is set to be wider than the top surface of the bottom electrode via 121a, so that the first portion 104a of the oxide layer 104 can surround the barrier layer 122. In some embodiments, oxide residues sputtered from the oxide layer 104 may impact and thereby remove tantalum-containing residues deposited on a sidewall of the MTJ 130, further lower the risk of shortage induced by tantalum-containing residues. Similar techniques can be applied to other embodiments in the present disclosure. Furthermore, since the upper portion 121a' of the bottom electrode via 121a below the top surface S104 of the first portion 104a may serve as a lattice barrier, the time period of the etching operation can be shortened due to total thickness reduction of the MTJ 130 with regard to omitting a bottom electrode (alternatively stated, a total amount of portions to be removed in the etching operation is reduced), therefore the risk of sputtering tantalum-containing residues from the barrier layer 122a may also be lowered.

Figure 9C:
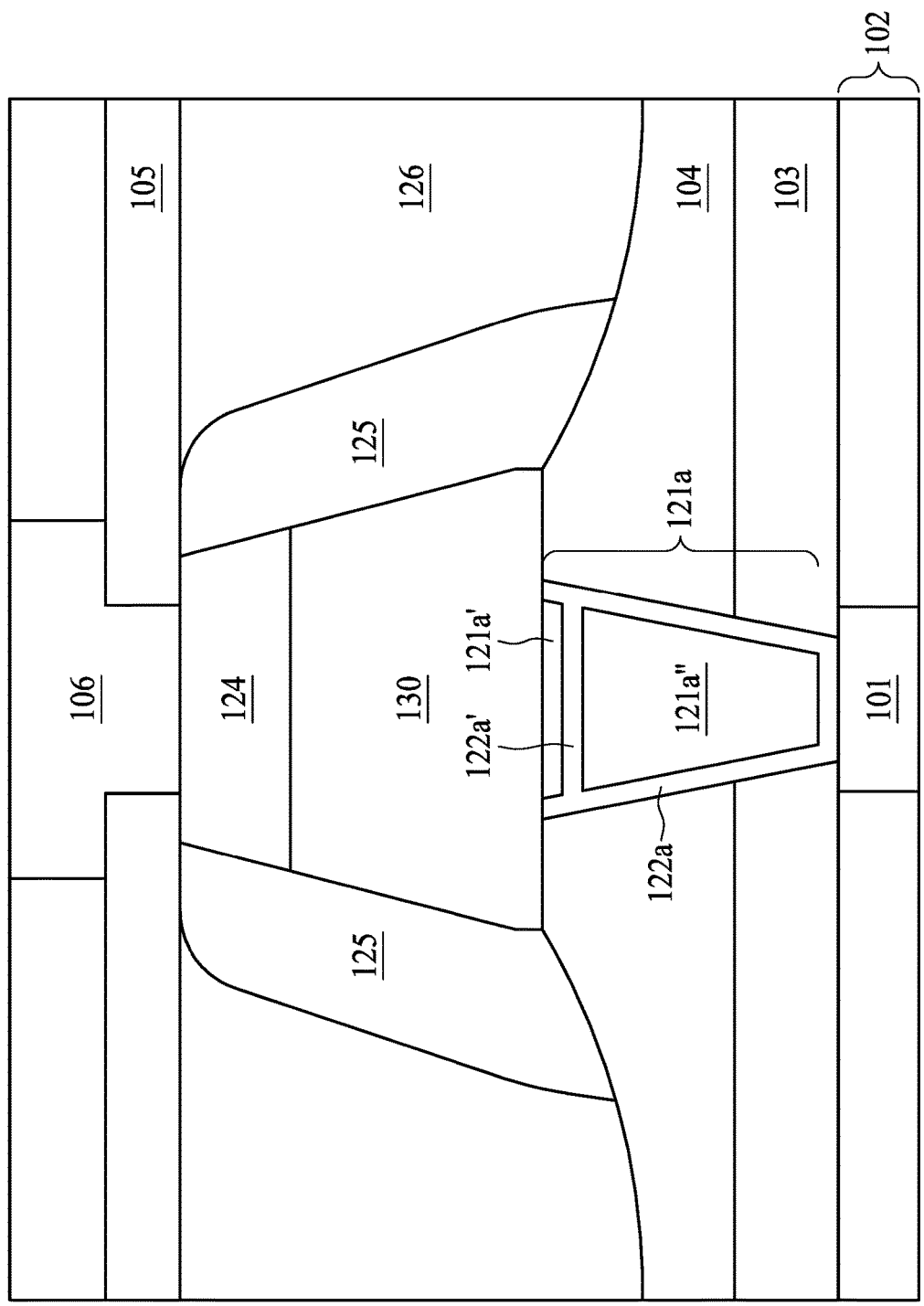

Referring to FIG. 9C, FIG. 9C is a cross section of the semiconductor structure 200A during intermediate stages of manufacturing operations, in accordance with some embodiments of the present disclosure. The sidewall spacer 125 is subsequently formed on the sidewall of the MTJ 130 and/or the top electrode 124 to prevent the MTJ 130 from being deteriorated by oxidation. The dielectric layer 126 is formed above the oxide layer 104, than the $(N+1)^{th}$ metal layer 105 and the contact 106 is formed above the dielectric layer 126, wherein the contact 106 may be electrically connected to the top electrode 124.

Figure 10A:
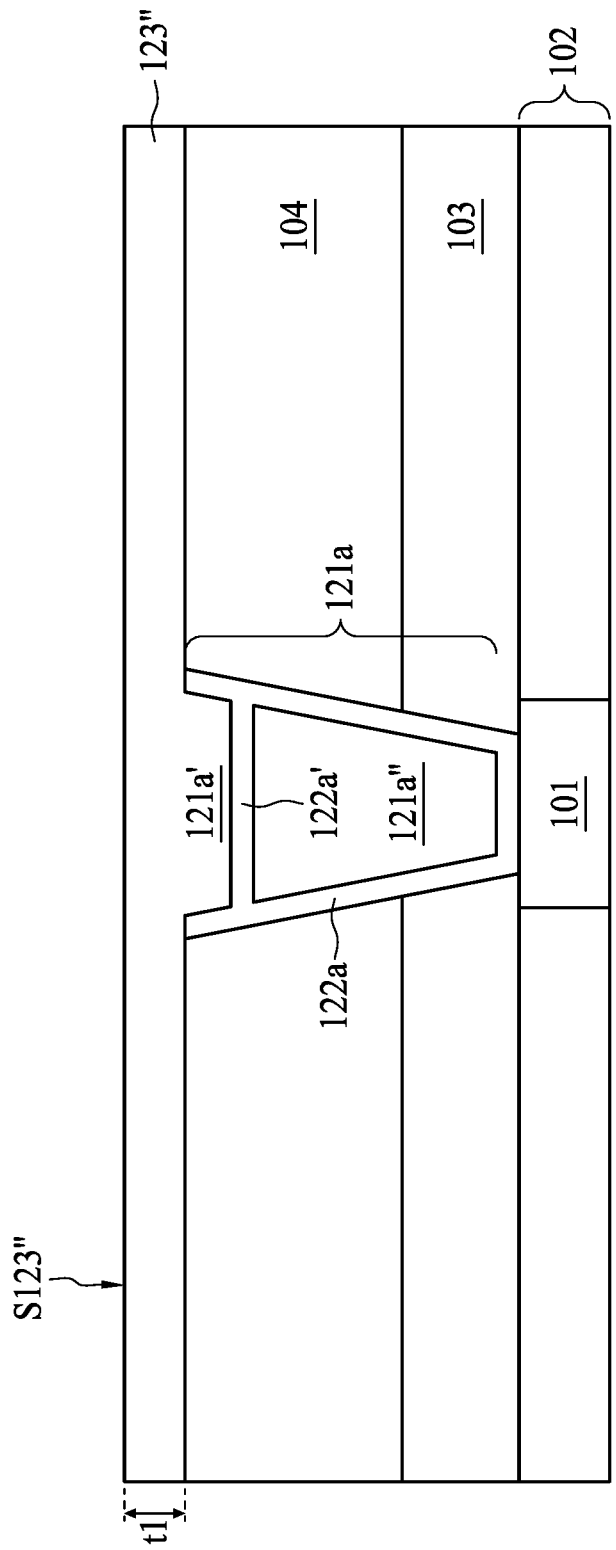
FIG. 10A to FIG. 10E are cross sections of a semiconductor structure during intermediate stages of manufacturing operations, in accordance with some embodiments of the present disclosure.

Referring to FIG. 10A, FIG. 10A is a cross section of the semiconductor structure 200B during intermediate stages of manufacturing operations, in accordance with some embodiments of the present disclosure. Subsequent to operations performed in FIG. 8C, a bottom electrode layer 123" having the same material as the bottom electrode via 121a is formed above the upper portion 121a' of the bottom electrode via 121a and the oxide layer 104.

Figure 10B:
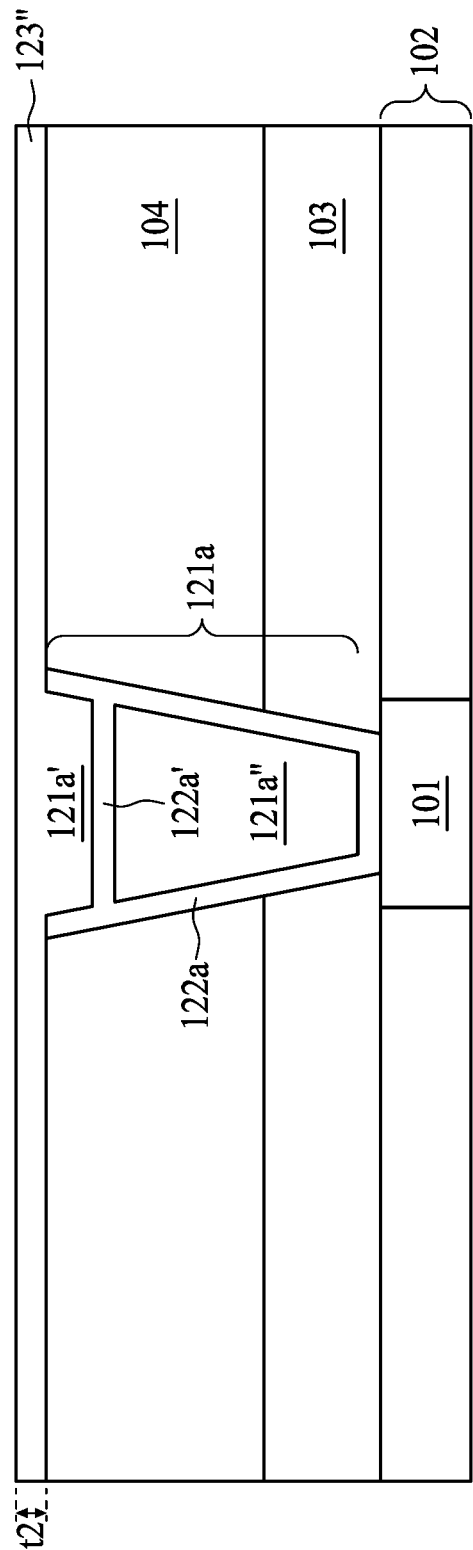

Referring to FIG. 10A and FIG. 10B, FIG. 10B is a cross section of the semiconductor structure 200B during intermediate stages of manufacturing operations, in accordance with some embodiments of the present disclosure. A planarization operation (such as chemical mechanical planarization operation) is optionally performed from a top surface S123" of the bottom electrode layer 123", wherein a thickness t1 of the bottom electrode layer 123" may be reduced to a thickness t2 less than the thickness t1. In some embodiments, the planarized top surface of the bottom electrode layer 123" may provide a finer surface for forming an MTJ layer 130' by virtue of lattice orientation, as will be discussed in FIG. 10C.

Figure 10C:
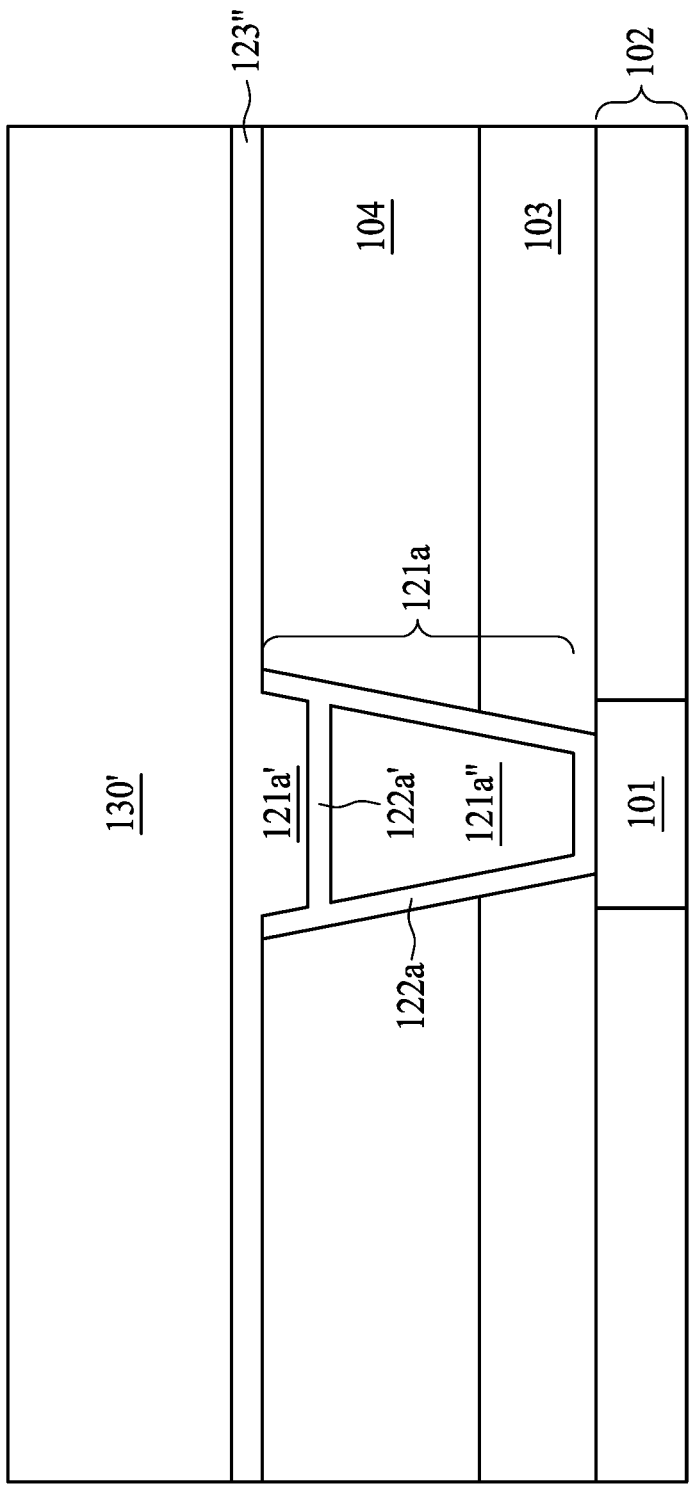

Referring to FIG. 10C, FIG. 10C is a cross section of the semiconductor structure 200B during intermediate stages of manufacturing operations, in accordance with some embodiments of the present disclosure. Subsequently the MTJ layer 130' is formed above the oxide layer 104 and the bottom electrode via 121a. As previously discussed, MTJ layer 130' is preferred to be formed on a (001) lattice surface, or a surface similar to (001) lattice plane. The interlayer portion 122a' serving as a lattice interrupter may prevent the MTJ layer 130' from following the lattice orientation of the lower portion 121a" of the bottom electrode via 121a, e.g., titanium nitride, which has a non-(001) crystal orientation.

Figure 10D:
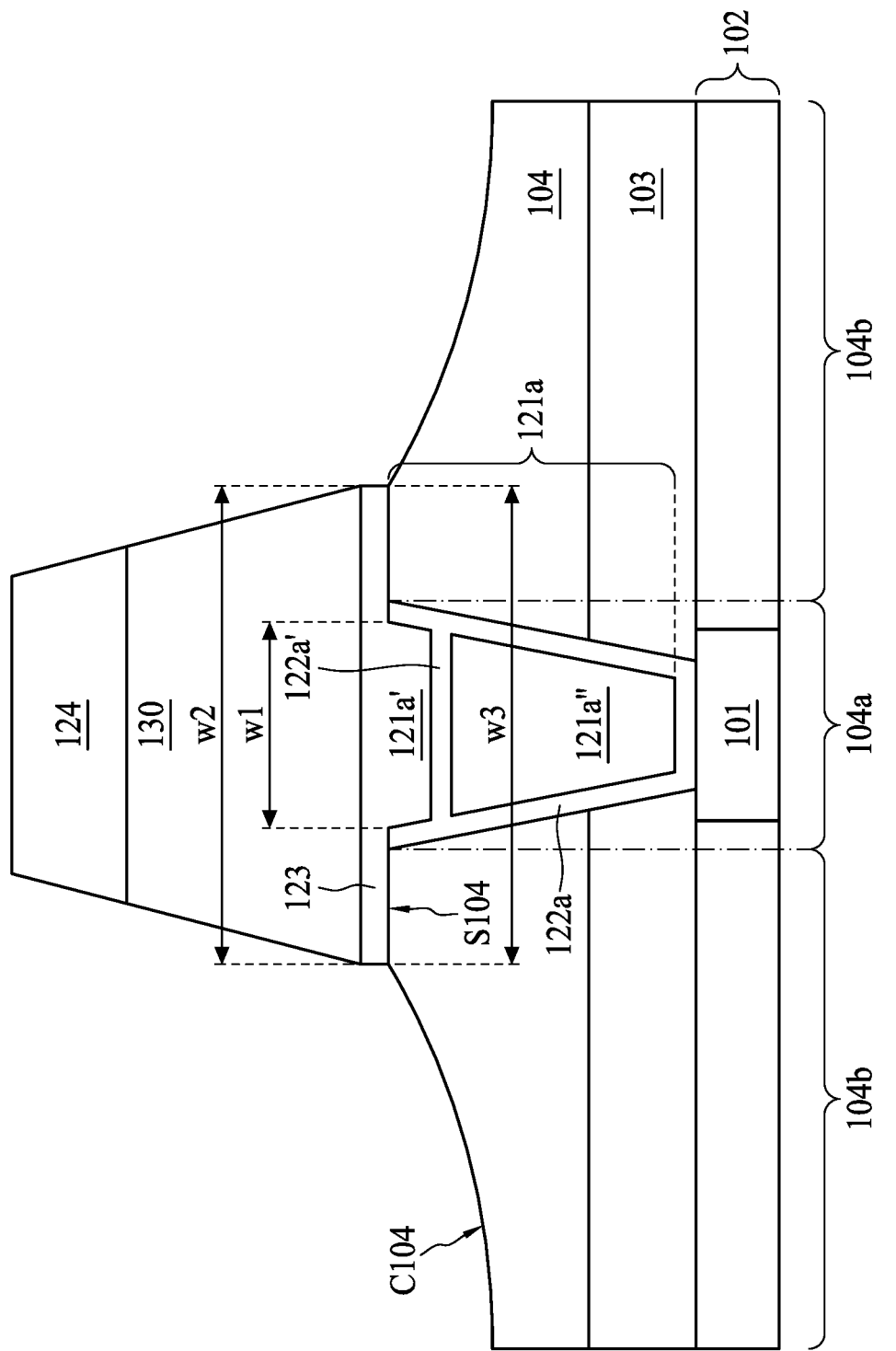

Referring to FIG. 10D, FIG. 10D is a cross section of the semiconductor structure 200B during intermediate stages of manufacturing operations, in accordance with some embodiments of the present disclosure. The top electrode 124 is subsequently formed above the MTJ layer 130', wherein the top electrode 124 can be used as a photomask. The MTJ layer 130' and the bottom electrode layer 123" are patterned by the top electrode 124 to form the MTJ 130 and the bottom electrode 123 respectively, wherein the MTJ 130 has the second width w2 greater than the first width w1 of the top surface of the bottom electrode via 121a, the bottom electrode 123 has the third width w3 greater than the first width w1, as the MTJ 130 may have a shape tapering away from the bottom electrode via 121a. The formation of the MTJ layer 130 may entail etching operation, such as ion beam etching (IBE) operation. The etching operation may remove a predetermined portion of the MTJ layer 130' and recess a portion of the oxide layer 104. Thereby the top surface C104 of the second portion 104b exposed from the top electrode 124 and/or the remaining MTJ 130 is lower than the top surface S104 of the first portion 104a, and the top surface C104 of the oxide layer 104 is concaved toward the $N^{th}$ metal layer 102. In some embodiments, the bottom electrode 123 being wider than the top surface of the bottom electrode via 121a may reduce oxide loss from the first portion 104a of the oxide layer 104.

Figure 10E:
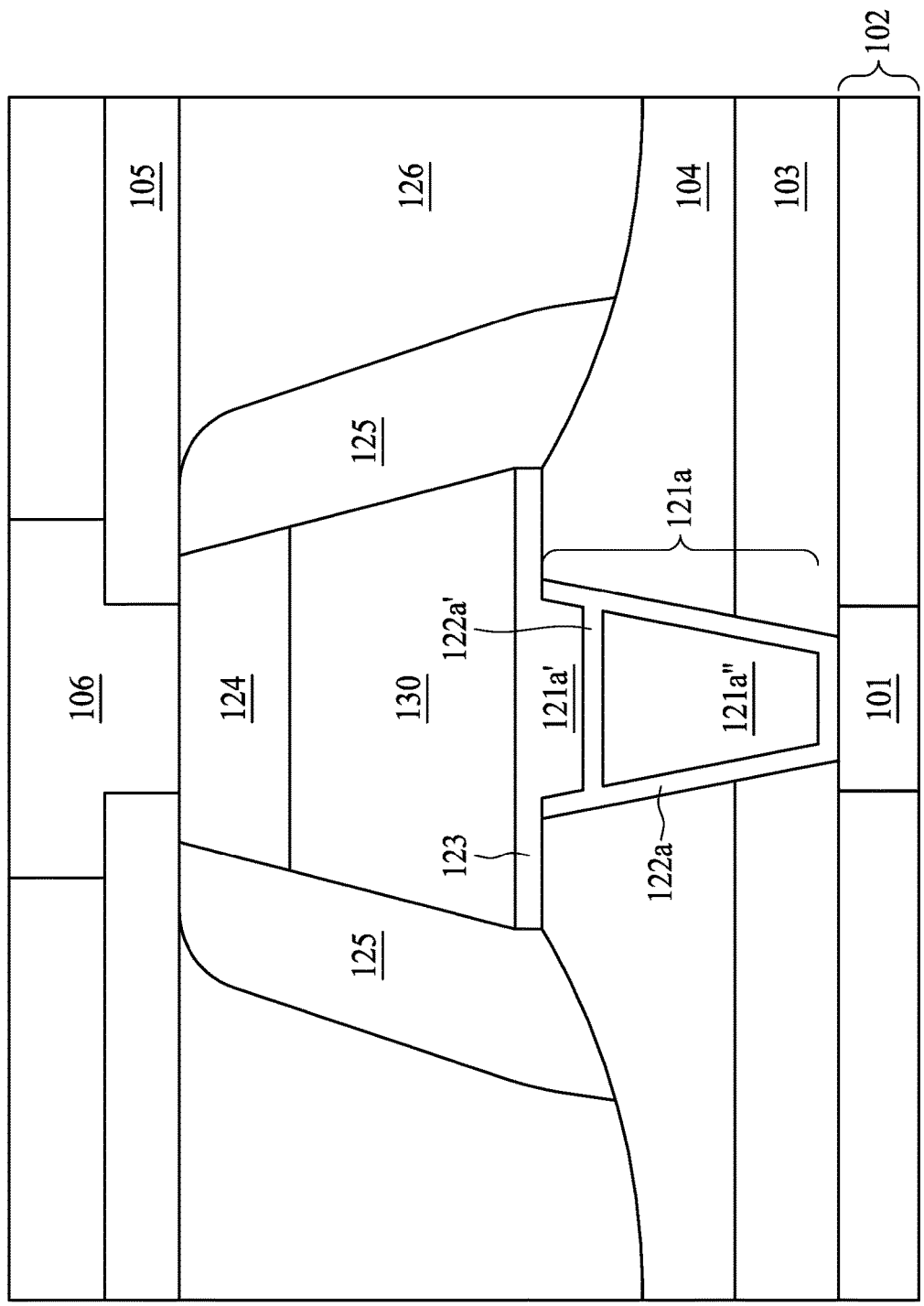

Referring to FIG. 10E, FIG. 10E is a cross section of the semiconductor structure 200B during intermediate stages of manufacturing operations, in accordance with some embodiments of the present disclosure. The sidewall spacer 125 is subsequently formed on the sidewall of the MTJ 130 and/or the top electrode 124 to prevent the MTJ 130 from being deteriorated by oxidation. The dielectric layer 126 is formed above the oxide layer 104, than the $(N+1)^{th}$ metal layer 105 and the contact 106 is formed above the dielectric layer 126, wherein the contact 106 may be electrically connected to the top electrode 124.

Hereinafter FIG. 11A to FIG. 11F are cross sections of the semiconductor structure 200C during intermediate stages of manufacturing operations, in accordance with some embodiments of the present disclosure.

Figure 11A:
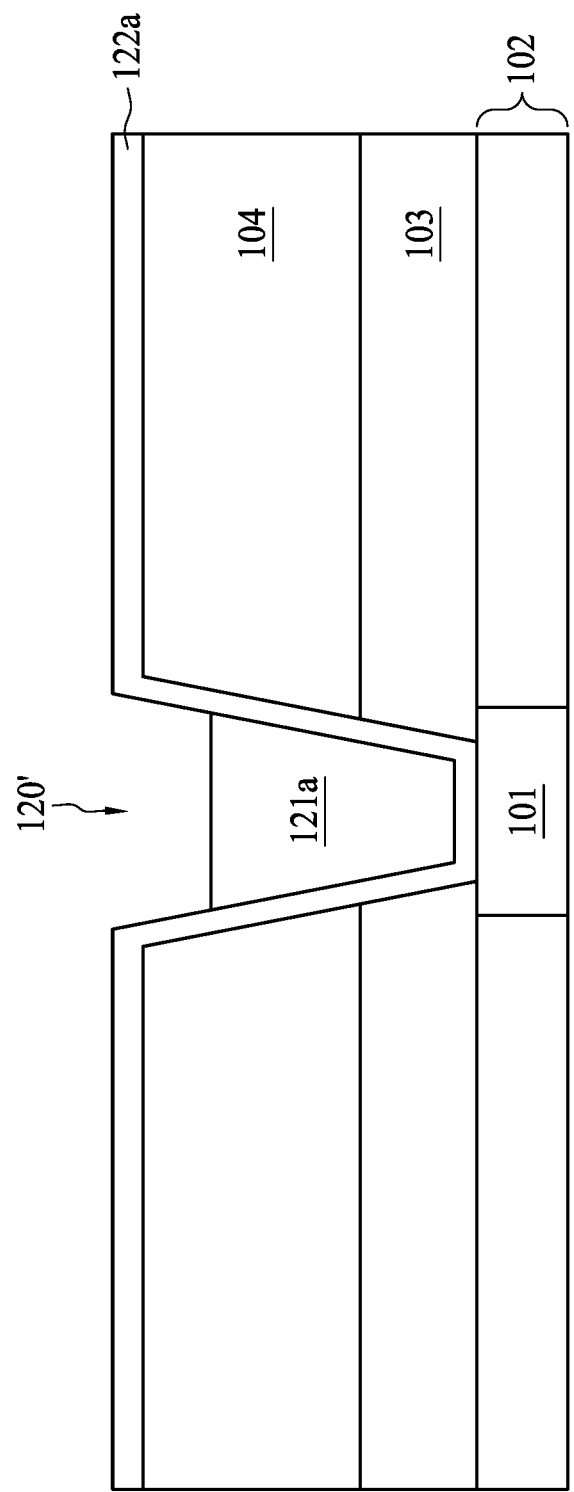

Referring to FIG. 11A, FIG. 11A is a cross section of the semiconductor structure 200C during intermediate stages of manufacturing operations, in accordance with some embodiments of the present disclosure. Subsequent to operations performed in FIG. 7, an etch operation, which may include dry etch operation and wet etch operation, are performed to remove a portion of the bottom electrode via 121a, thereby a second via trench 120' is formed. Herein a top surface of the etched bottom electrode via 121a is lower than a top surface of the barrier layer 122a. In some embodiments, the etching agent utilized herein may include halogen gas, such as chlorine gas ($Cl_2$).

Figure 11B:
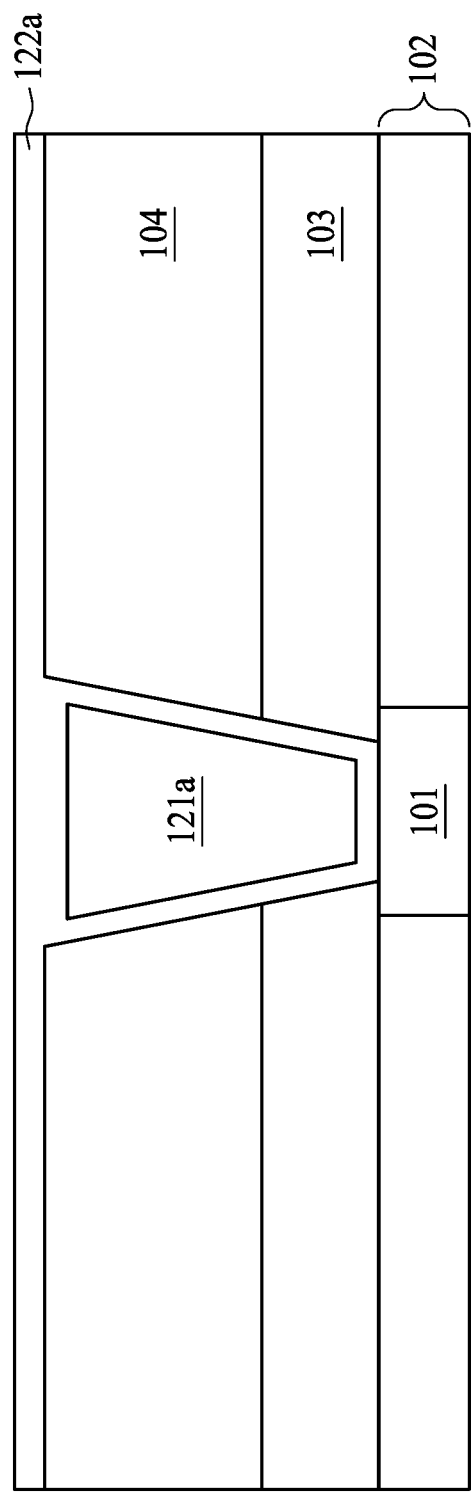

Referring to FIG. 11B, FIG. 11B is a cross section of the semiconductor structure 200C during intermediate stages of manufacturing operations, in accordance with some embodiments of the present disclosure. In some embodiments, a material identical to the barrier layer 122a is formed inside the second via trench 120'. In some other embodiments, other suitable material different from the barrier layer 122a can also be formed inside the second via trench 120'.

Figure 11C:
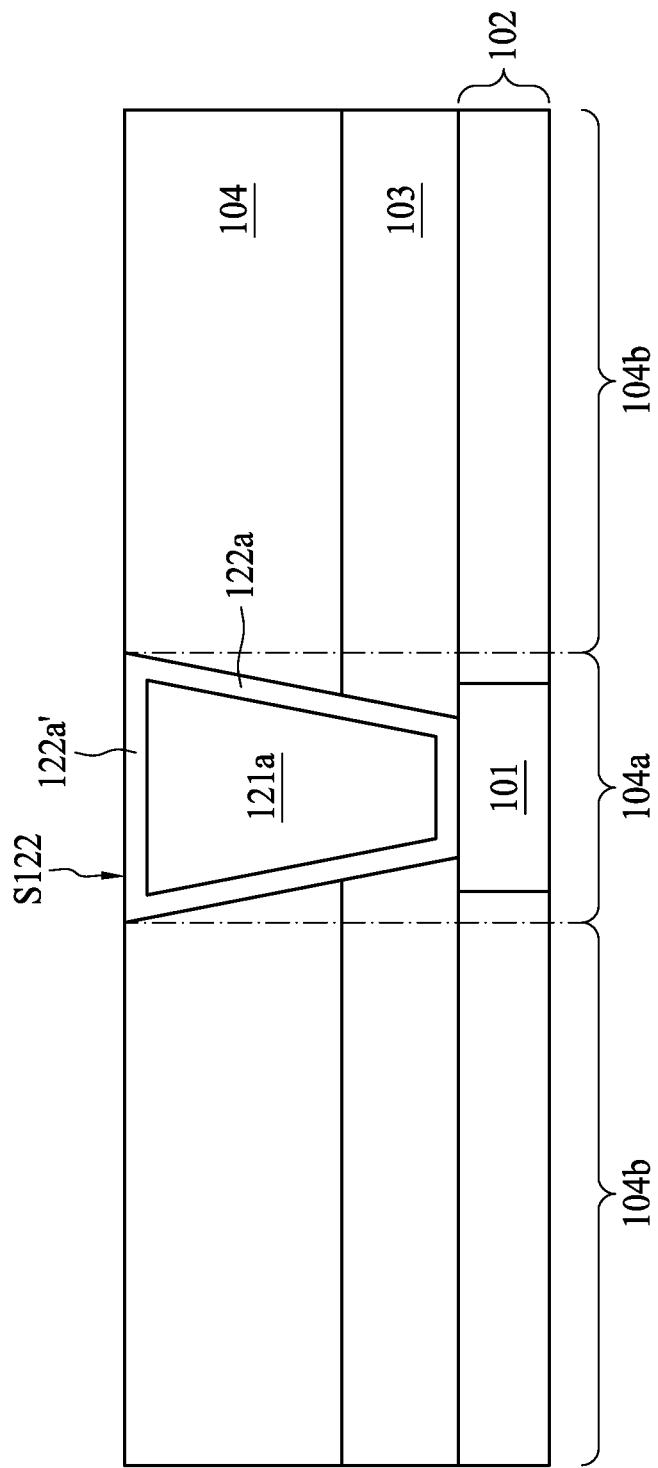

Referring to FIG. 11C, FIG. 11C is a cross section of the semiconductor structure 200C during intermediate stages of manufacturing operations, in accordance with some embodiments of the present disclosure. A planarization operation (such as chemical mechanical planarization) is subsequently performed from above the barrier layer 122a. In some embodiments, a top surface of the second portion 104b of the oxide layer 104 is exposed. The top surface S122 of the barrier layer 122a is substantially coplanar with the top surface of the second portion 104b of the oxide layer 104. In some other embodiments, a thickness of the barrier layer 122a is reduced to be in a range from about 1 nm to about 5 nm, which can reduce the oxide loss during the fabrication operation of MTJ 130 (the fabrication operation of MTJ 130 will be discussed in FIG. 11E). Herein a portion of the barrier layer 122a above the bottom electrode via 121a is denoted as an interlayer portion 122a' of the barrier layer 122a.

Figure 11D:
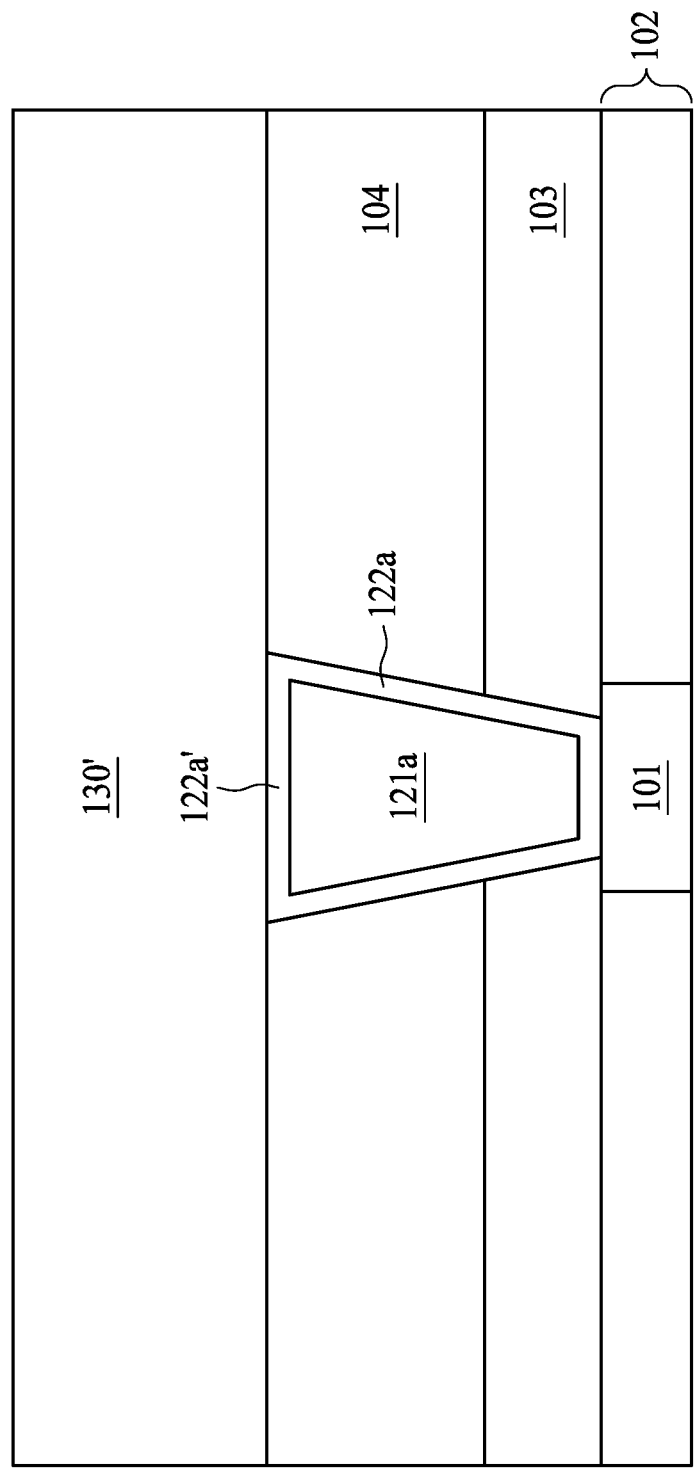

Referring to FIG. 11D, FIG. 11D is a cross section of the semiconductor structure 200C during intermediate stages of manufacturing operations, in accordance with some embodiments of the present disclosure. Subsequently the MTJ layer 130' is formed above the oxide layer 104 and the bottom electrode via 121a. As previously discussed, MTJ layer 130' is preferred to be formed on a (001) lattice surface, or a surface similar to (001) lattice plane. The interlayer portion 122a' of the barrier layer 122a serving as a lattice interrupter may prevent the MTJ layer 130' from following the lattice orientation of the bottom electrode via 121a, e.g., titanium nitride, which has a non-(001) crystal orientation.

Figure 11E:
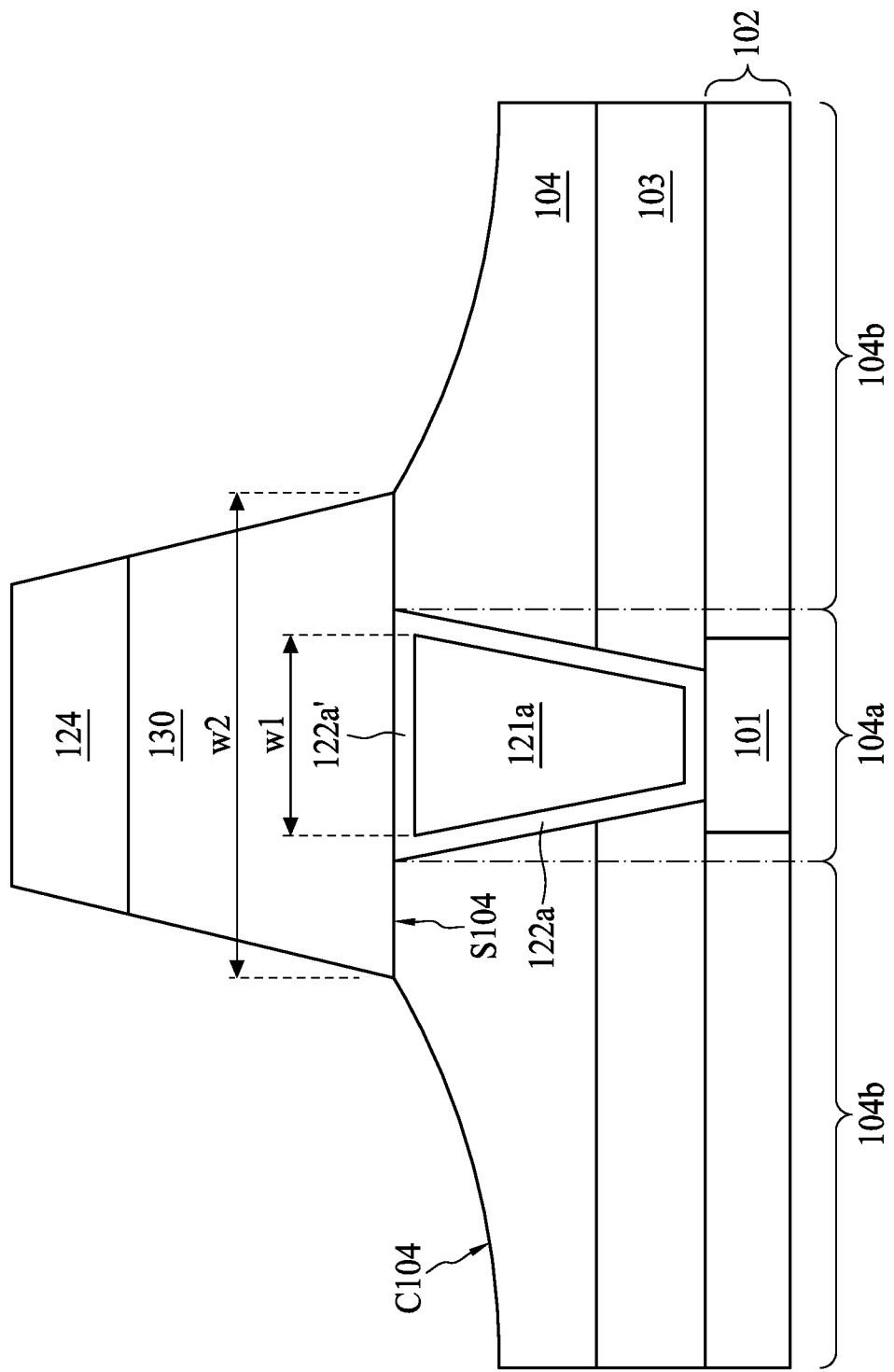

Referring to FIG. 11E, FIG. 11E is a cross section of the semiconductor structure 200C during intermediate stages of manufacturing operations, in accordance with some embodiments of the present disclosure. The top electrode 124 is subsequently formed above the MTJ layer 130', wherein the top electrode 124 can be used as a photomask. The MTJ layer 130' and the bottom electrode layer 123" are patterned by the top electrode 124 to form the MTJ 130 and the bottom electrode 123 respectively, wherein the MTJ 130 has the second width w2 greater than the first width w1 of the top surface of the bottom electrode via 121a, as the MTJ 130 may have a shape tapering away from the bottom electrode via 121a. The formation of the MTJ layer 130 may entail etching operation, such as ion beam etching (IBE) operation. The etching operation may remove a predetermined portion of the MTJ layer 130' and recess a portion of the oxide layer 104. Thereby the top surface C104 of the second portion 104b exposed from the top electrode 124 and/or the remaining MTJ 130 is lower than the top surface S104 of the first portion 104a, and the top surface C104 of the oxide layer 104 is concaved toward the $N^{th}$ metal layer 102. In some other embodiments, a barrier layer (not shown in FIG. 11E) remained above the oxide layer 104 having a thickness in a range from about 1 nm to about 5 nm may reduce the loss of the oxide layer 104 during the etching operation.

Referring to FIG. 11F FIG. 11F is a cross section of the semiconductor structure 200C during intermediate stages of manufacturing operations, in accordance with some embodiments of the present disclosure. The sidewall spacer 125 is subsequently formed on the sidewall of the MTJ 130 and/or the top electrode 124 to prevent the MTJ 130 from being deteriorated by oxidation. The dielectric layer 126 is formed above the oxide layer 104, than the $(N+1)^{th}$ metal layer 105 and the contact 106 is formed above the dielectric layer 126, wherein the contact 106 may be electrically connected to the top electrode 124.

Figure 12:
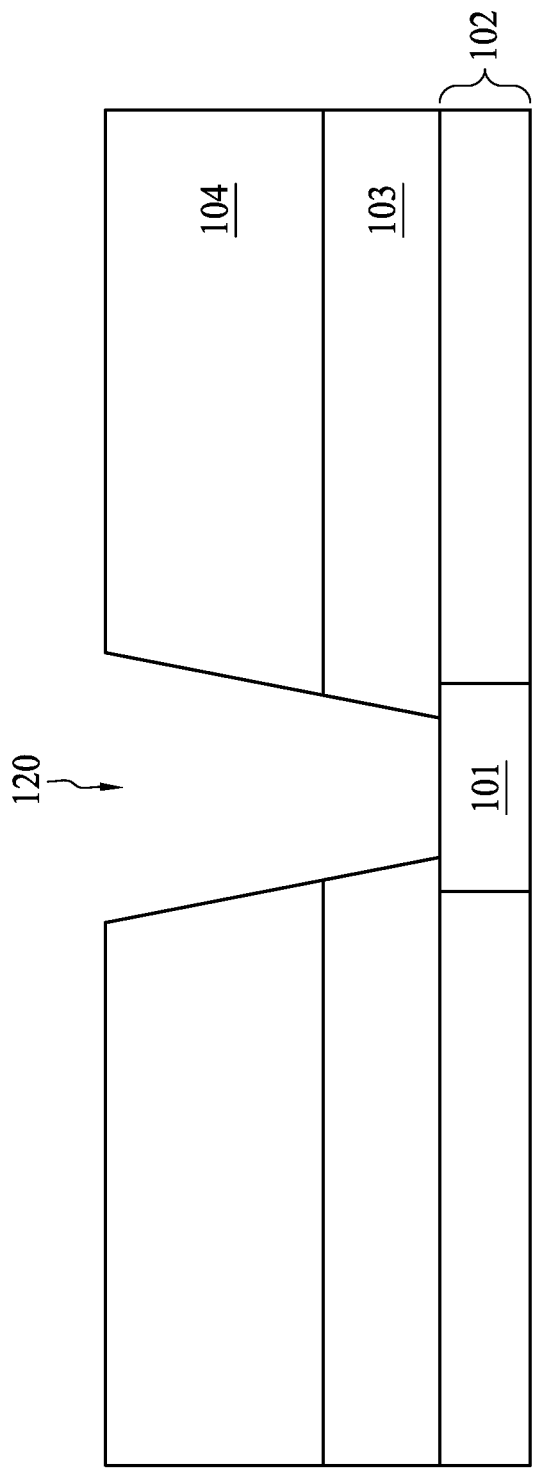
FIG. 12 to FIG. 14 are cross sections of a semiconductor structure during intermediate stages of manufacturing operations, in accordance with some embodiments of the present disclosure.
Figure 13:
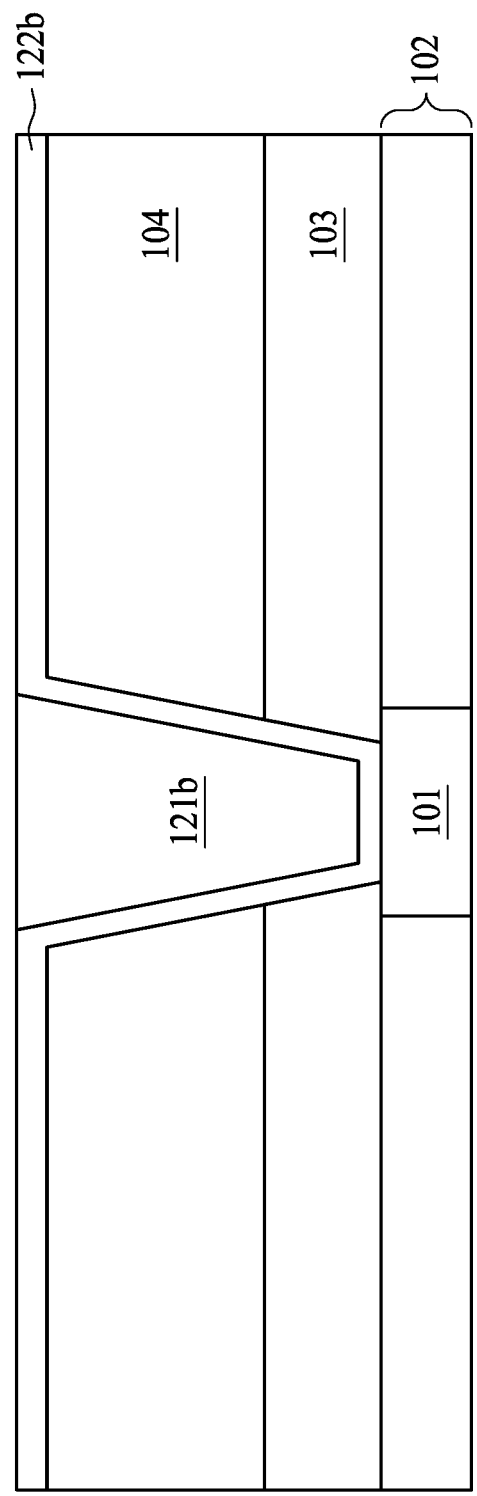
Figure 14:
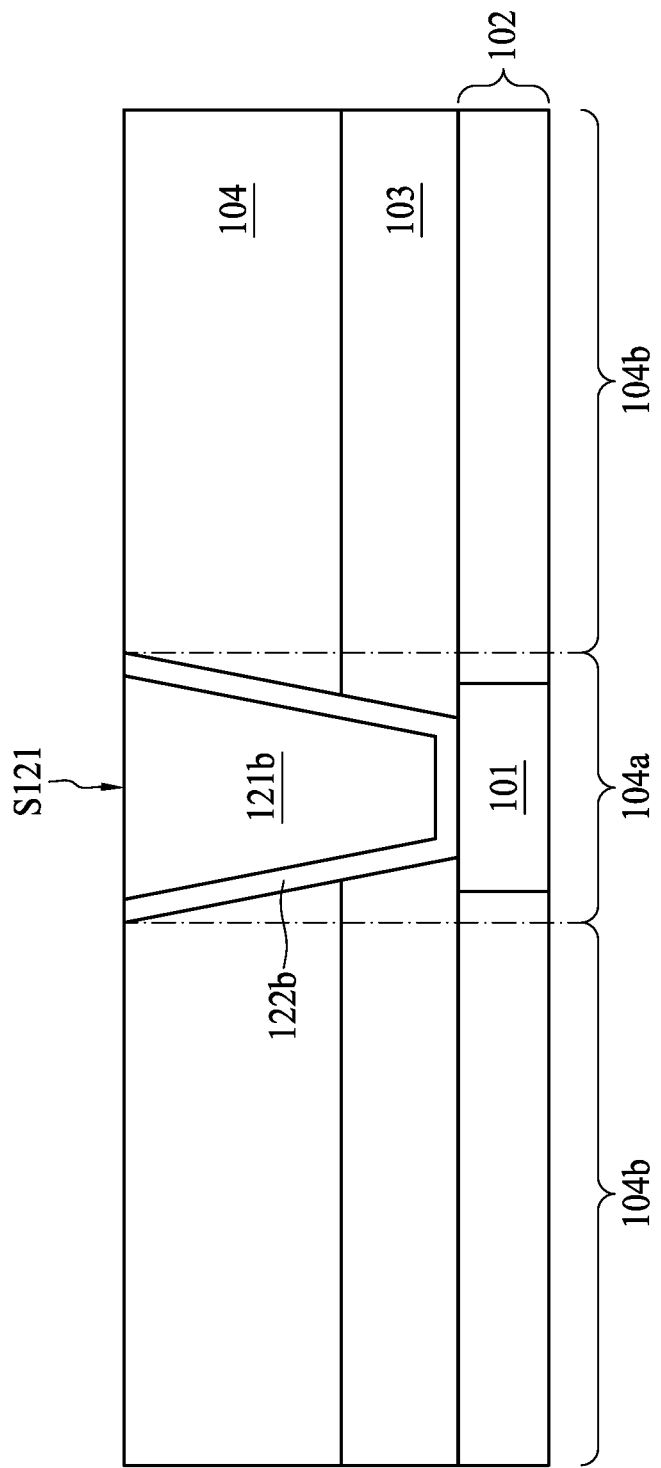

Hereinafter FIG. 12 to FIG. 14 are cross sections of the semiconductor structure 300A, the semiconductor structure 300B, or the semiconductor structure 300C during intermediate stages of manufacturing operations, in accordance with some embodiments of the present disclosure.

Referring to FIG. 12, FIG. 12 is a cross section of a semiconductor structure during intermediate stages of manufacturing operations, in accordance with some embodiments of the present disclosure. The $N^{th}$ metal layer 102 and the $N^{th}$ metal line 101 in the $N^{th}$ metal layer 102 are formed. The oxide layer 104 is formed above the $N^{th}$ metal layer 102 (or above the etch stop layer 103 if the etch stop layer 103 is formed). In some embodiments, the oxide layer 104 may include tetraethoxysilane (TEOS), which can be formed by various deposition techniques. A first via trench 120 is subsequently formed in the oxide layer 104 and above the $N^{th}$ metal line 101. In some embodiments, the etch stop layer 103 is optionally formed above the $N^{th}$ metal layer 102 prior to forming the oxide layer 104, wherein the operation of etching the oxide layer 104 for forming the first via trench 120 can be controlled by the etch stop layer 103.

Referring to FIG. 13, FIG. 13 is a cross section of a semiconductor structure during intermediate stages of manufacturing operations, in accordance with some embodiments of the present disclosure. A barrier layer 122b is formed above the oxide layer 104, above the $N^{th}$ metal line 101, and conformably on a sidewall of the first via trench 120. The barrier layer 122b may include titanium nitride (TiN), or the like. The bottom electrode via 121b is formed inside the first via trench 120, wherein the bottom electrode via 121b is laterally surrounded by the barrier layer 122b. In some embodiments, the bottom electrode via 121b may include tungsten (W) to prevent diffusion issues therefrom. In some embodiments, the bottom electrode via 121b may be formed by chemical vapor deposition, physical vapor deposition (PVD), atomic layer deposition (ALD), electroplating, or other suitable operations. The barrier layer 122b being free from tantalum (Ta) may reduce the risk of tantalum-containing residues being sputtered therefrom in subsequently performed etching operation.

Referring to FIG. 14, FIG. 14 is a cross section of a semiconductor structure during intermediate stages of manufacturing operations, in accordance with some embodiments of the present disclosure. A planarization operation (such as chemical mechanical planarization) is subsequently performed above the barrier layer 122b and the bottom electrode via 121b, as a top surface of the second portion 104b of the oxide layer 104 is exposed. The top surface S121 of the bottom electrode via 121b is substantially coplanar with the top surface of the second portion 104b of the oxide layer 104.

Figure 15A:
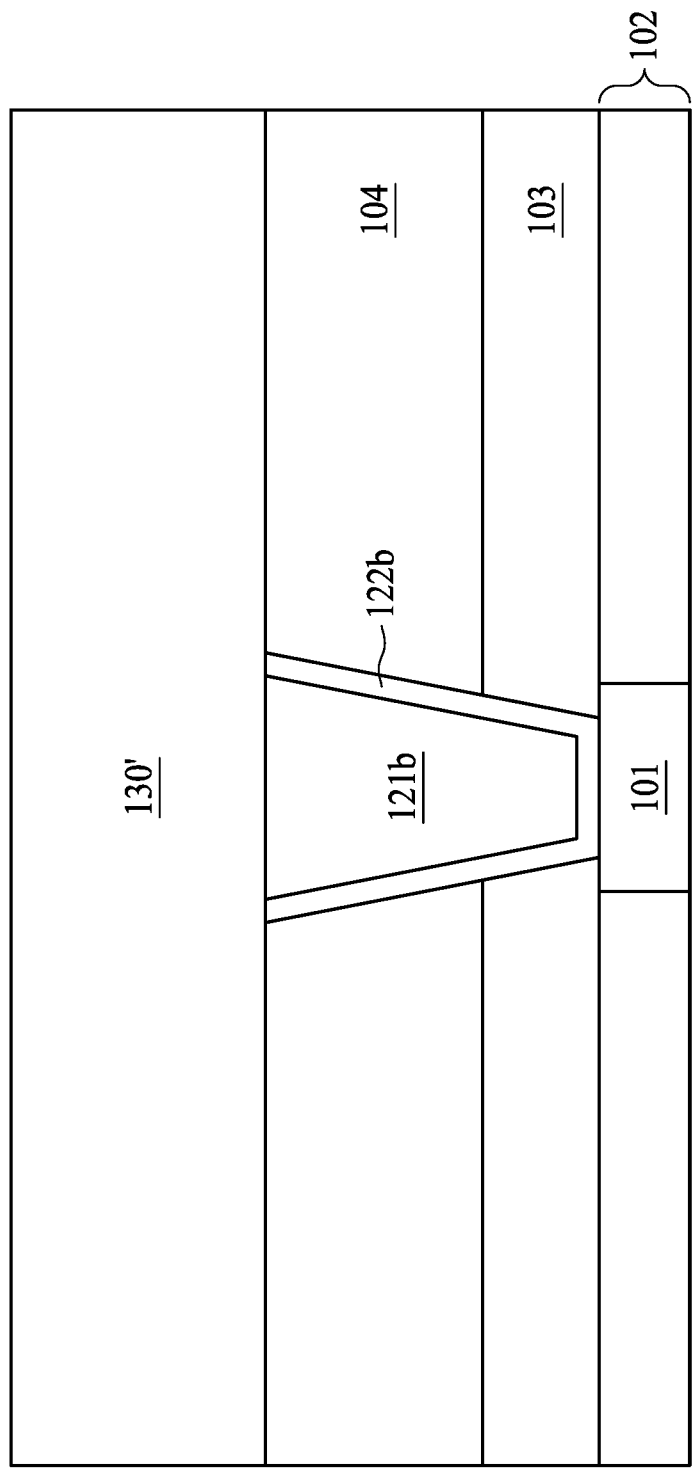
FIG. 15A to FIG. 15C are cross sections of a semiconductor structure during intermediate stages of manufacturing operations, in accordance with some embodiments of the present disclosure.
Figure 15B:
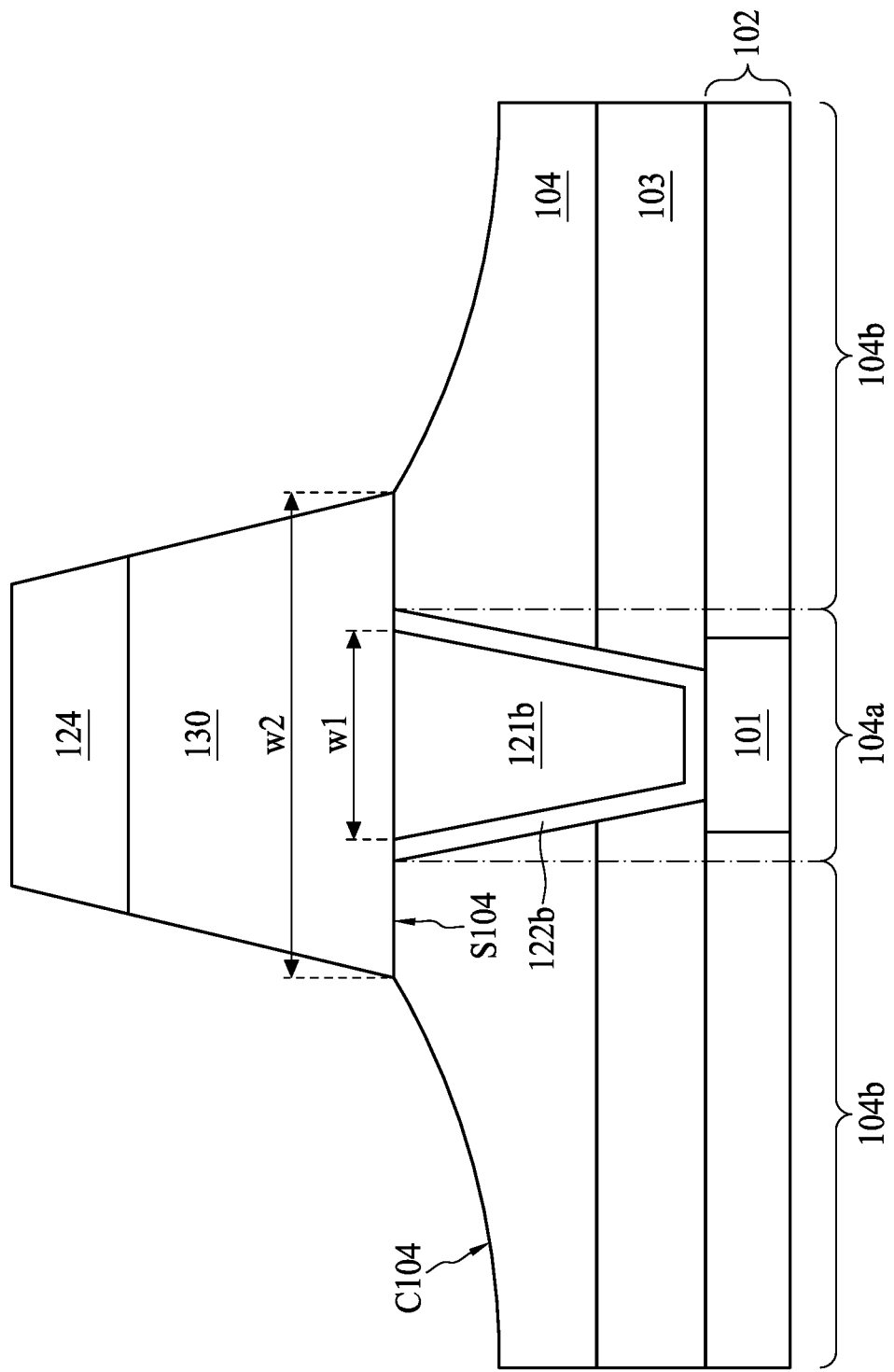
Figure 15C:
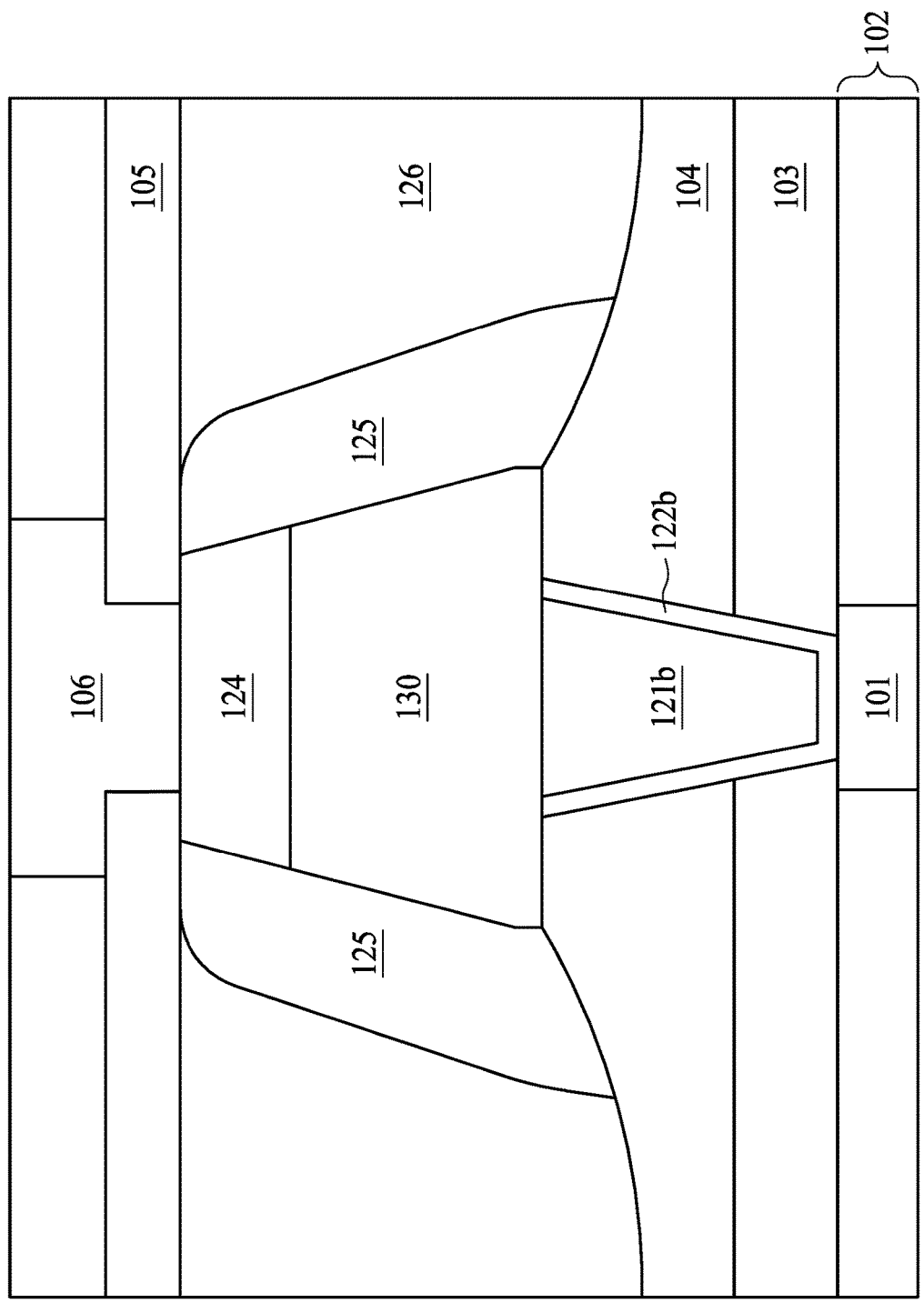

Hereinafter FIG. 15A to FIG. 15C are cross sections of the semiconductor structure 300A during intermediate stages of manufacturing operations, FIG. 16A to FIG. 16E are cross sections of the semiconductor structure 300B during intermediate stages of manufacturing operations, and FIG. 17A to FIG. 17H are cross sections of the semiconductor structure 300C during intermediate stages of manufacturing operations in accordance with some embodiments of the present disclosure.

Referring to FIG. 15A, FIG. 15A is a cross section of the semiconductor structure 300A during intermediate stages of manufacturing operations, in accordance with some embodiments of the present disclosure. Subsequently the MTJ layer 130' is formed above the oxide layer 104 and the bottom electrode via 121b. As previously discussed, MTJ layer 130' is preferred to be formed on a (001) lattice surface, or a surface similar to (001) lattice plane. Herein the bottom electrode via 121b directly contacting with a bottom surface of the MTJ layer 130' may prevent the MTJ layer 130' from following the lattice orientation of the bottom electrode via 121b, e.g., tungsten.

Referring to FIG. 15B, FIG. 15B is a cross section of the semiconductor structure 300A during intermediate stages of manufacturing operations, in accordance with some embodiments of the present disclosure. The top electrode 124 is subsequently formed above the MTJ layer 130', wherein the top electrode 124 can be used as a photomask. The MTJ layer 130' and the bottom electrode layer 123" are patterned by the top electrode 124 to form the MTJ 130 and the bottom electrode 123 respectively, wherein the MTJ 130 has the second width w2 greater than the first width w1 of the top surface of the bottom electrode via 121b, as the MTJ 130 may have a shape tapering away from the bottom electrode via 121b. The formation of the MTJ layer 130 may entail etching operation, such as ion beam etching (IBE) operation. The etching operation may remove a predetermined portion of the MTJ layer 130' and recess a portion of the oxide layer 104. Thereby the top surface C104 of the second portion 104b exposed from the top electrode 124 and/or the remaining MTJ 130 is lower than the top surface S104 of the first portion 104a, and the top surface C104 of the oxide layer 104 is concaved toward the $N^{th}$ metal layer 102.

Since no bottom electrode is between the MTJ 130 and the bottom electrode via 121b, the time period of the etching operation can be shortened due to total thickness reduction of the MTJ 130 with regard to omitting a bottom electrode, therefore the risk of sputtering tantalum-containing residues from the barrier layer 122a may also be lowered.

Referring to FIG. 15C, FIG. 15C is a cross section of the semiconductor structure 300A during intermediate stages of manufacturing operations, in accordance with some embodiments of the present disclosure. The sidewall spacer 125 is subsequently formed on the sidewall of the MTJ 130 and/or the top electrode 124 to prevent the MTJ 130 from being deteriorated by oxidation. The dielectric layer 126 is formed above the oxide layer 104, than the $(N+1)^{th}$ metal layer 105 and the contact 106 is formed above the dielectric layer 126, wherein the contact 106 may be electrically connected to the top electrode 124.

Figure 16A:
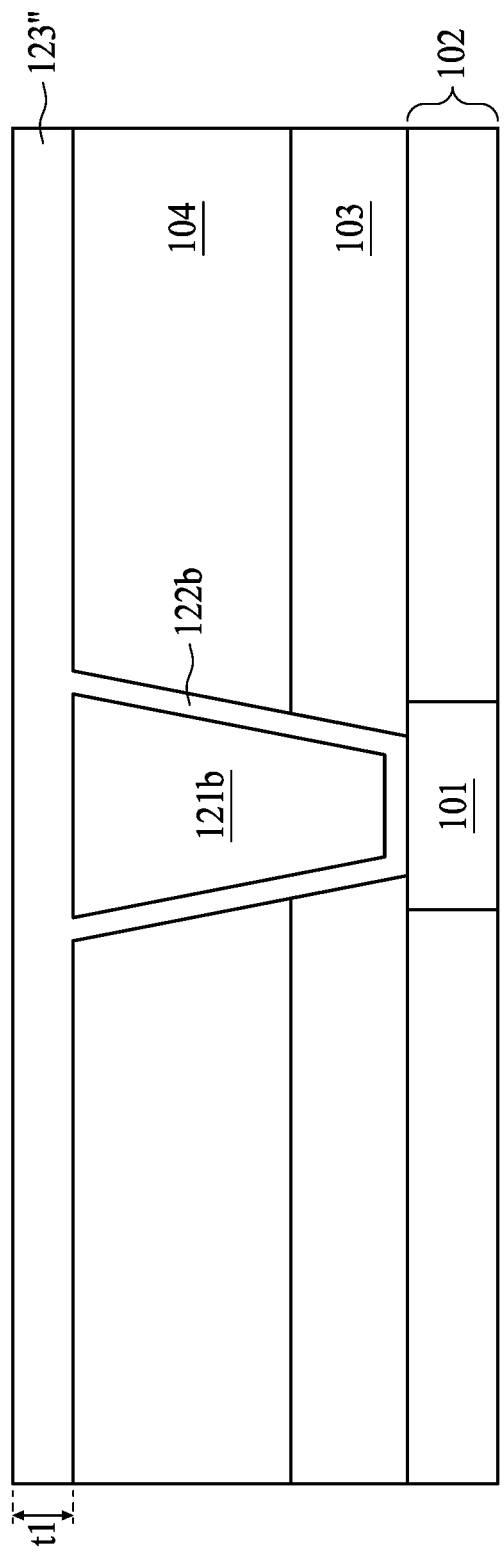
FIG. 16A to FIG. 16E are cross sections of a semiconductor structure during intermediate stages of manufacturing operations, in accordance with some embodiments of the present disclosure.

Referring to FIG. 16A, FIG. 16A is a cross section of the semiconductor structure 300B during intermediate stages of manufacturing operations, in accordance with some embodiments of the present disclosure. Subsequent to operations performed in FIG. 14, a bottom electrode layer 123" having the same material as the barrier layer 122*b* is formed above the bottom electrode via 121*b* and the oxide layer 104.

Figure 16B:
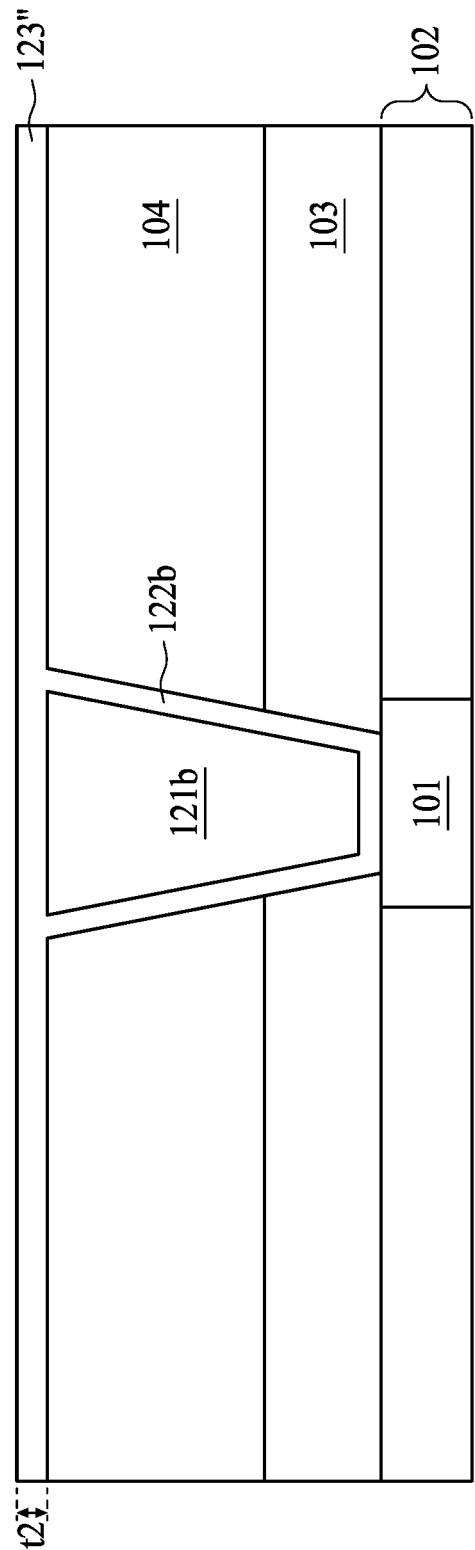

Referring to FIG. 16A and FIG. 16B, FIG. 16B is a cross section of the semiconductor structure 300B during intermediate stages of manufacturing operations, in accordance with some embodiments of the present disclosure. A planarization operation (such as chemical mechanical planarization operation) is optionally performed from a top surface S123" of the bottom electrode layer 123", wherein a thickness t1 of the bottom electrode layer 123" may be reduced to a thickness t2 less than the thickness t1. In some embodiments, the planarized top surface of the bottom electrode layer 123" may provide a finer surface for forming an MTJ layer 130' by virtue of lattice orientation, as will be discussed in FIG. 16C.

Figure 16C:
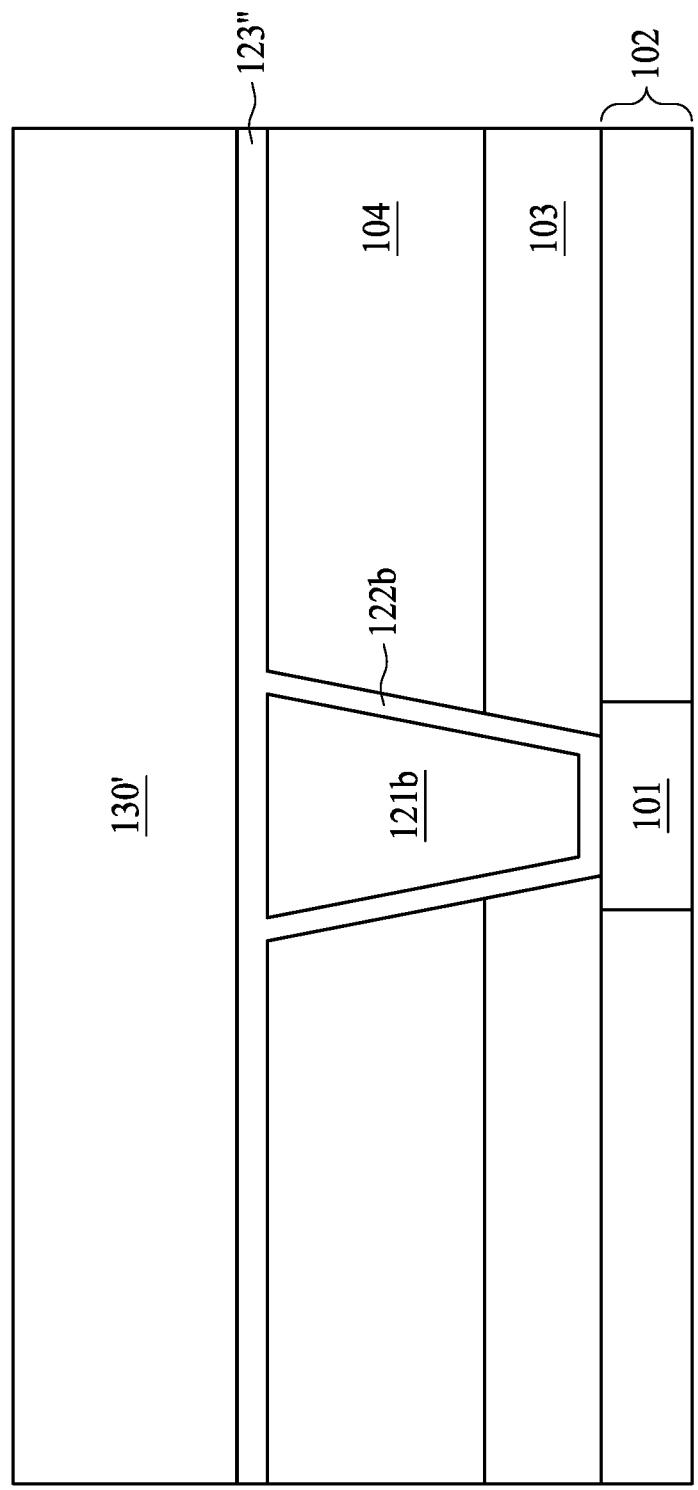

Referring to FIG. 16C, FIG. 16C is a cross section of the semiconductor structure 300B during intermediate stages of manufacturing operations, in accordance with some embodiments of the present disclosure. Subsequently the MTJ layer 130' is formed above the oxide layer 104 and the bottom electrode via 121*b*. As previously discussed, MTJ layer 130' is preferred to be formed on a (001) lattice surface, or a surface similar to (001) lattice plane. Herein the bottom electrode layer 123" directly contacting with a bottom surface of the MTJ layer 130' may prevent the MTJ layer 130' from following the lattice orientation of the bottom electrode via 121*b*, e.g., tungsten.

Figure 16D:
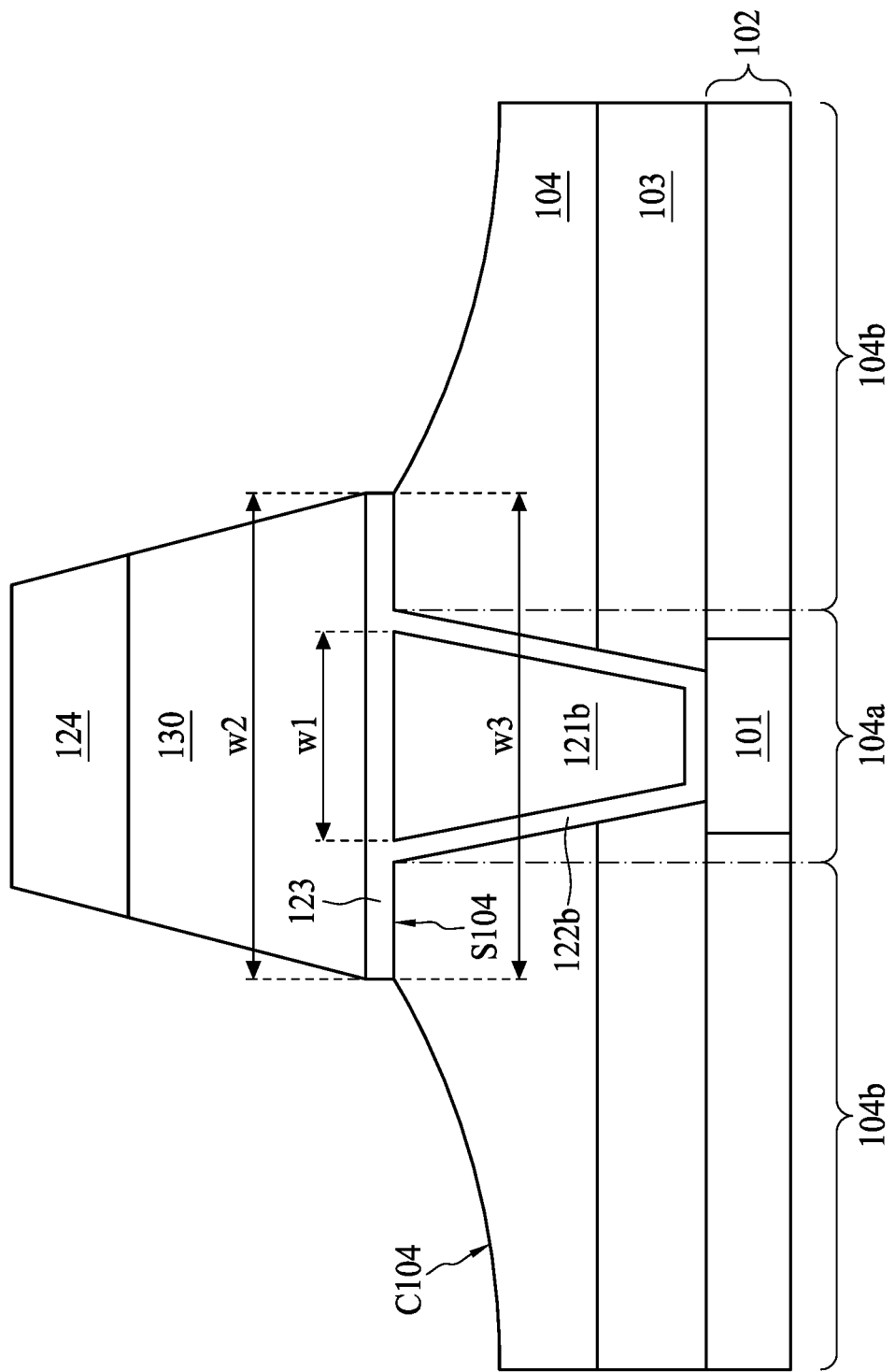

Referring to FIG. 16D, FIG. 16D is a cross section of the semiconductor structure 300B during intermediate stages of manufacturing operations, in accordance with some embodiments of the present disclosure. The top electrode 124 is subsequently formed above the MTJ layer 130', wherein the top electrode 124 can be used as a photomask. The MTJ layer 130' and the bottom electrode layer 123" are patterned by the top electrode 124 to form the MTJ 130 and the bottom electrode 123 respectively, wherein the MTJ 130 has the second width w2 greater than the first width w1 of the top surface of the bottom electrode via 121*b*, the bottom electrode 123 has the third width w3 greater than the first width w1, as the MTJ 130 may have a shape tapering away from the bottom electrode via 121*b*. The formation of the MTJ layer 130 may entail etching operation, such as ion beam etching (IBE) operation. The etching operation may remove a predetermined portion of the MTJ layer 130' and recess a portion of the oxide layer 104. Thereby the top surface C104 of the second portion 104*b* exposed from the top electrode 124 and/or the remaining MTJ 130 is lower than the top surface S104 of the first portion 104*a*, and the top surface C104 of the oxide layer 104 is concaved toward the $N^{th}$ metal layer 102. In some embodiments, the bottom electrode 123 being wider than the top surface of the bottom electrode via 121*b* may reduce oxide loss from the first portion 104*a* of the oxide layer 104.

Figure 16E:
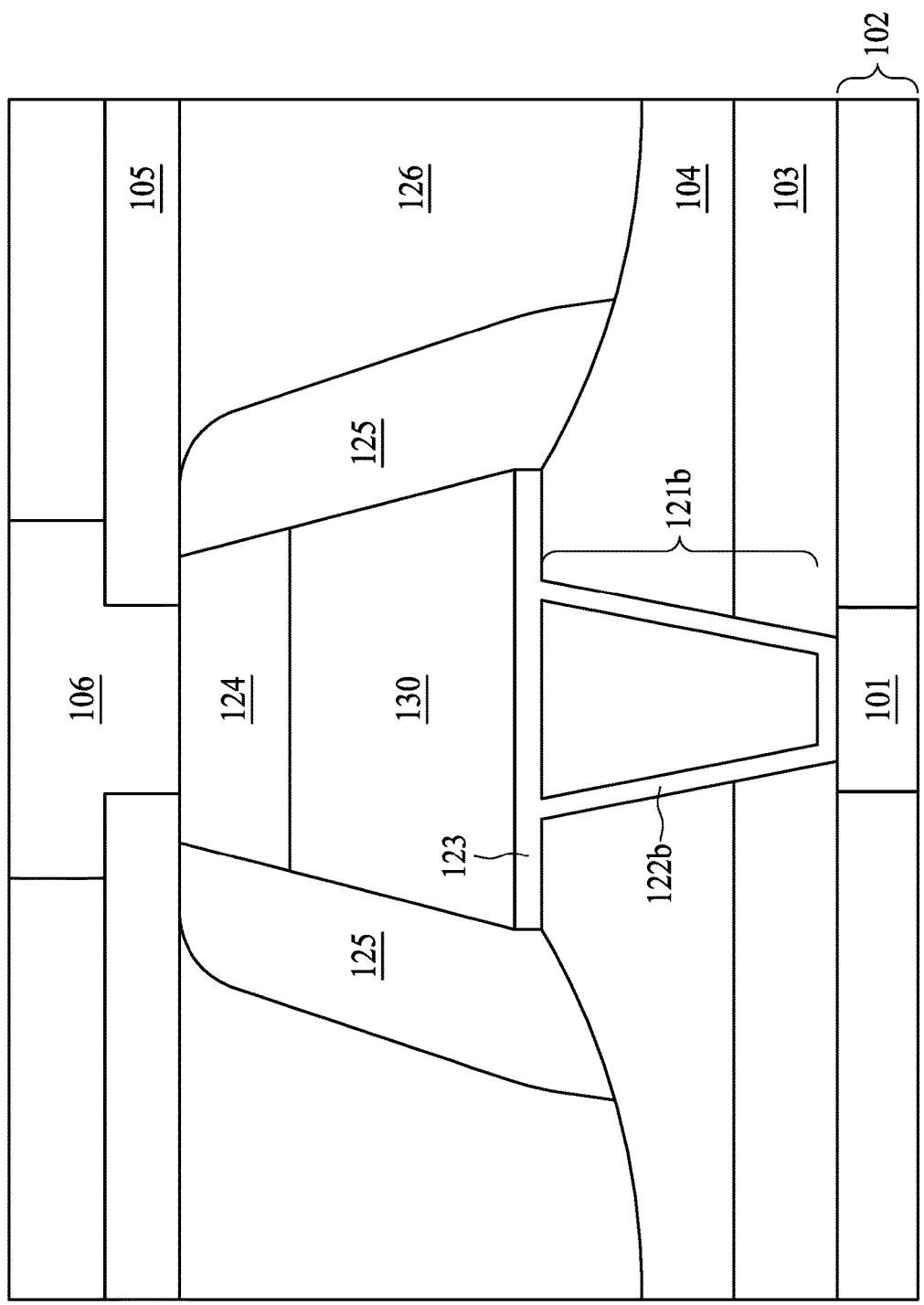

Referring to FIG. 16E, FIG. 16E is a cross section of the semiconductor structure 300B during intermediate stages of manufacturing operations, in accordance with some embodiments of the present disclosure. The sidewall spacer 125 is subsequently formed on the sidewall of the MTJ 130 and/or the top electrode 124 to prevent the MTJ 130 from being deteriorated by oxidation. The dielectric layer 126 is formed above the oxide layer 104, than the $(N+1)^{th}$ metal layer 105 and the contact 106 is formed above the dielectric layer 126, wherein the contact 106 may be electrically connected to the top electrode 124.

Figure 17A:
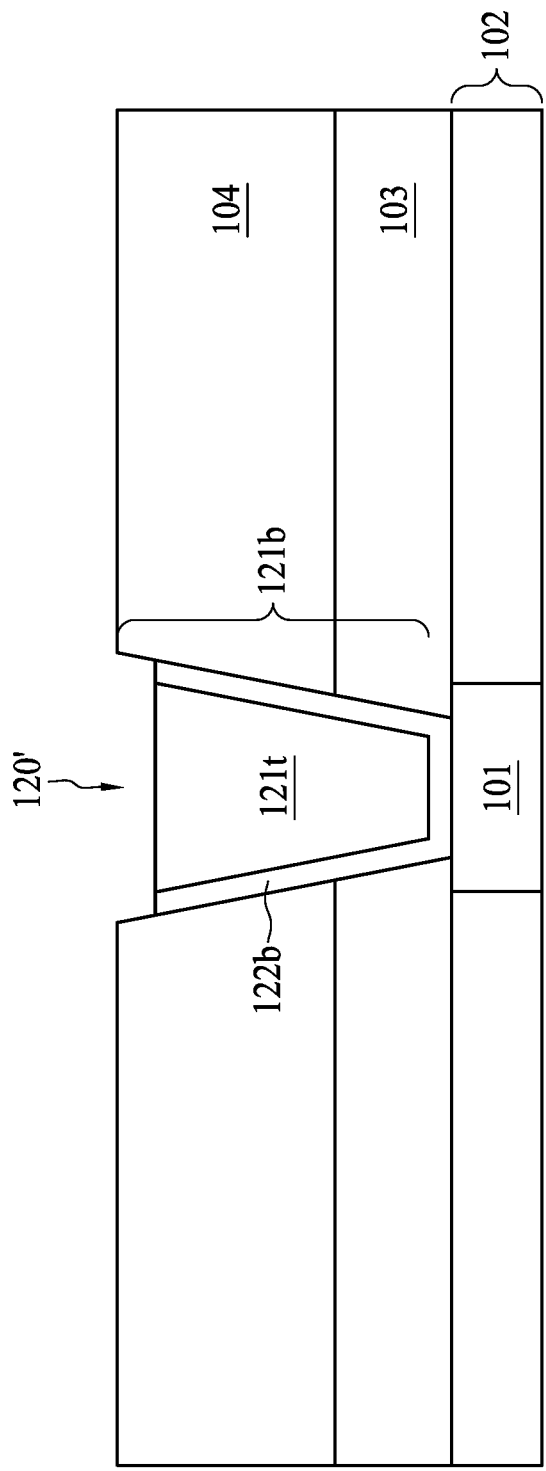
FIG. 17A to FIG. 17H are cross sections of a semiconductor structure during intermediate stages of manufacturing operations, in accordance with some embodiments of the present disclosure.

Referring to FIG. 17A, FIG. 17A is a cross section of the semiconductor structure 300C during intermediate stages of manufacturing operations, in accordance with some embodiments of the present disclosure. Subsequent to the operations performed in FIG. 14, an etch operation, which may include dry etch operation and wet etch operation, are performed to remove a portion of the bottom electrode via 121*b*, thereby a second via trench 120' is formed. In some embodiments, a portion of the barrier layer 122*b* may also be removed, as the oxide layer 104 may, or may not be exposed from a sidewall of the second via trench 120'. Herein a top surface of the etched bottom electrode via 121*b* is lower than a top surface of the barrier layer 122*b*.

Figure 17B:
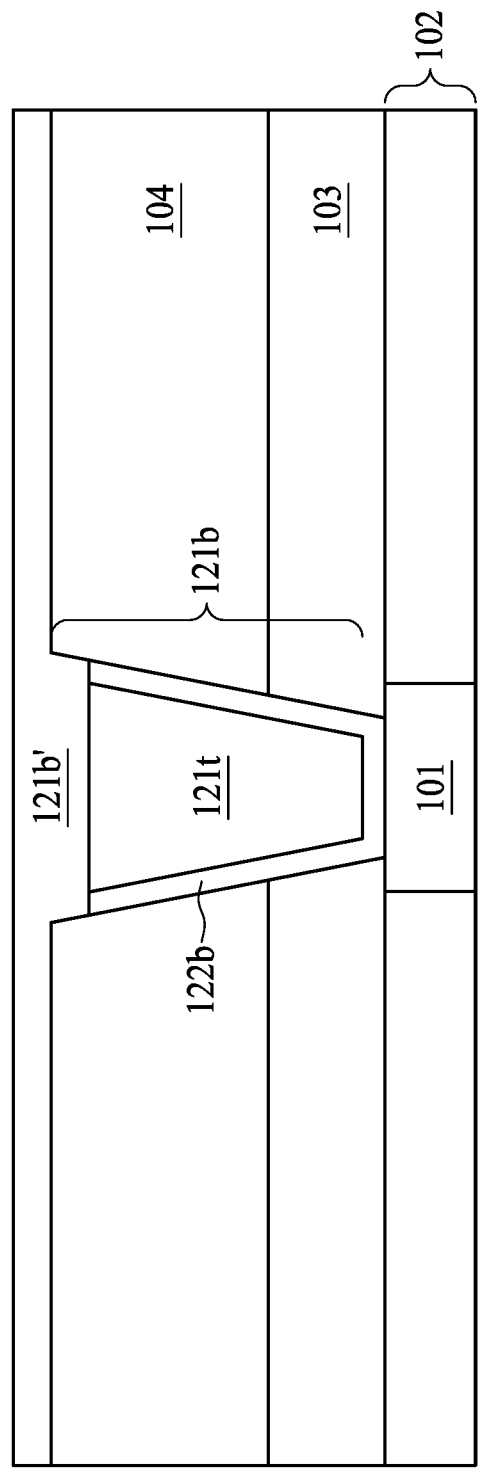

Referring to FIG. 17B, FIG. 17B is a cross section of the semiconductor structure 300C during intermediate stages of manufacturing operations, in accordance with some embodiments of the present disclosure. An amorphous layer 121*b*' is formed above the oxide layer 104 and a tungsten portion 121*t* of the bottom electrode via 121*b*. In some embodiments, the amorphous layer 121*b*' can include tantalum derivatives such as tantalum nitride (TaN).

Figure 17C:
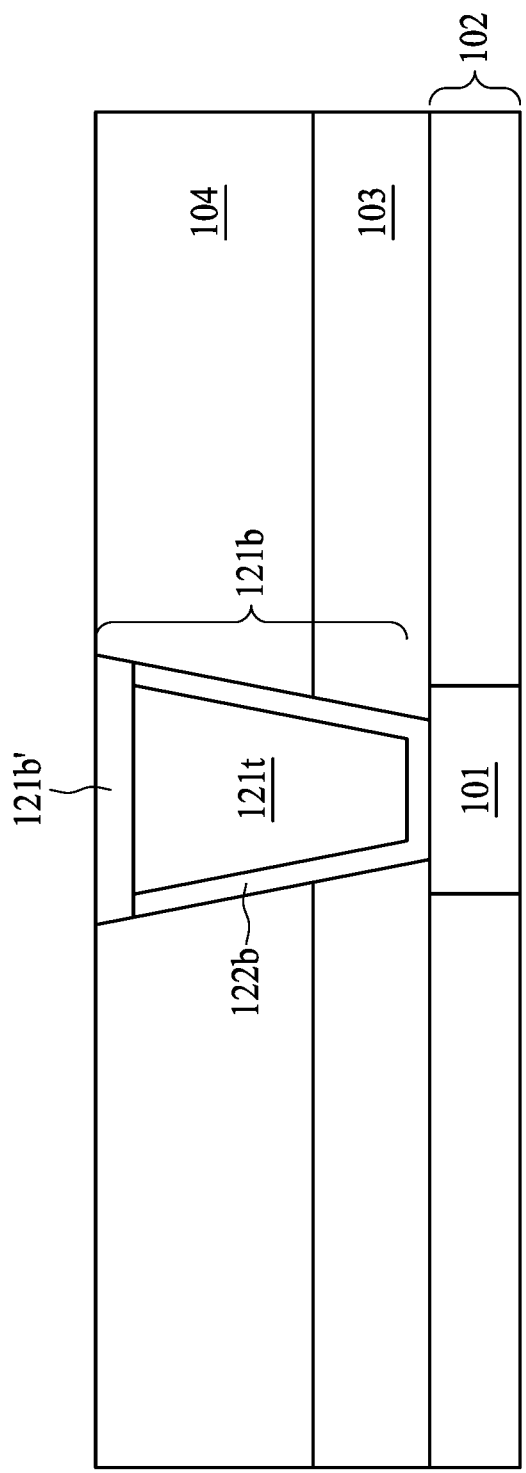

Referring to FIG. 17C, FIG. 17C is a cross section of the semiconductor structure 300C during intermediate stages of manufacturing operations, in accordance with some embodiments of the present disclosure. A planarization operation (such as chemical mechanical planarization) is subsequently performed from above the amorphous layer 121*b*'', as a top surface of the second portion 104*b* of the oxide layer 104 is exposed, and the amorphous cap 121*b*' is thereby formed. A top surface S121 of the bottom electrode via 121*a* (which is identical with the top surface of the amorphous cap 121*b*') is substantially coplanar with the top surface of the second portion 104*b* of the oxide layer 104.

Figure 17D:
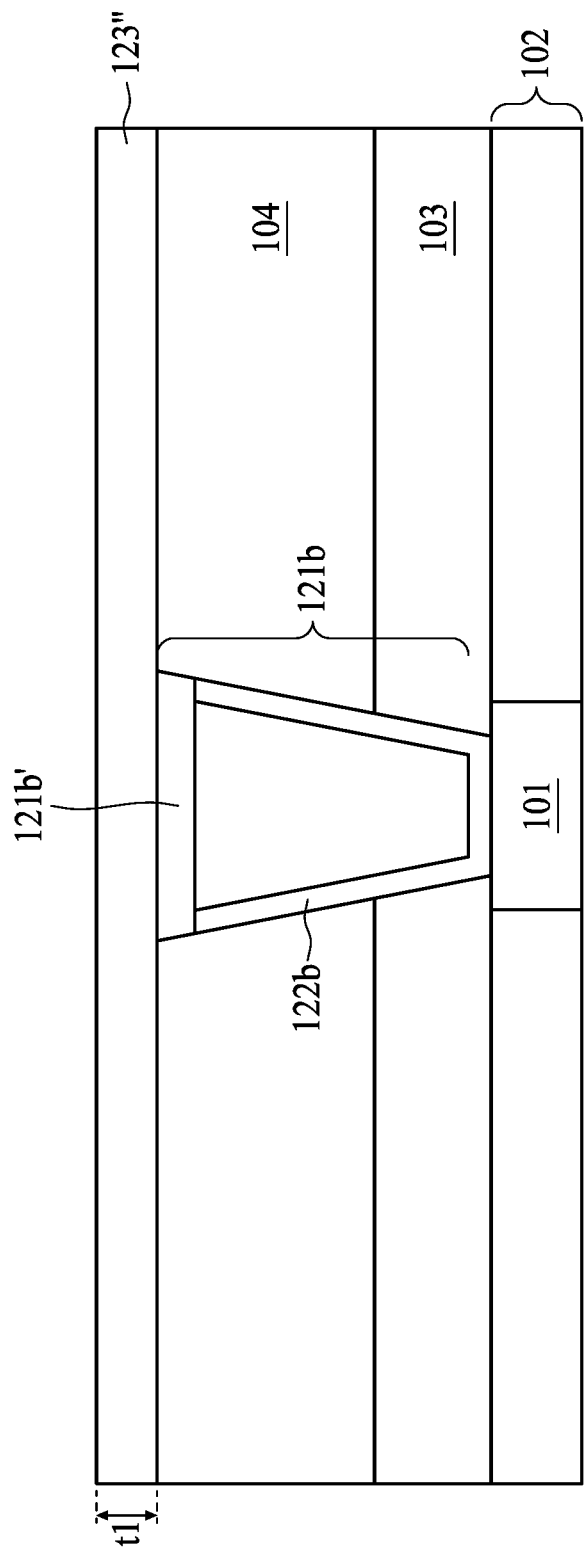

Referring to FIG. 17D, FIG. 17D is a cross section of the semiconductor structure 300C during intermediate stages of manufacturing operations, in accordance with some embodiments of the present disclosure. Subsequent to operations performed in FIG. 14, a bottom electrode layer 123" having the same material as the barrier layer 122*b* is formed above the amorphous cap 121*b*' and the oxide layer 104.

Figure 17E:
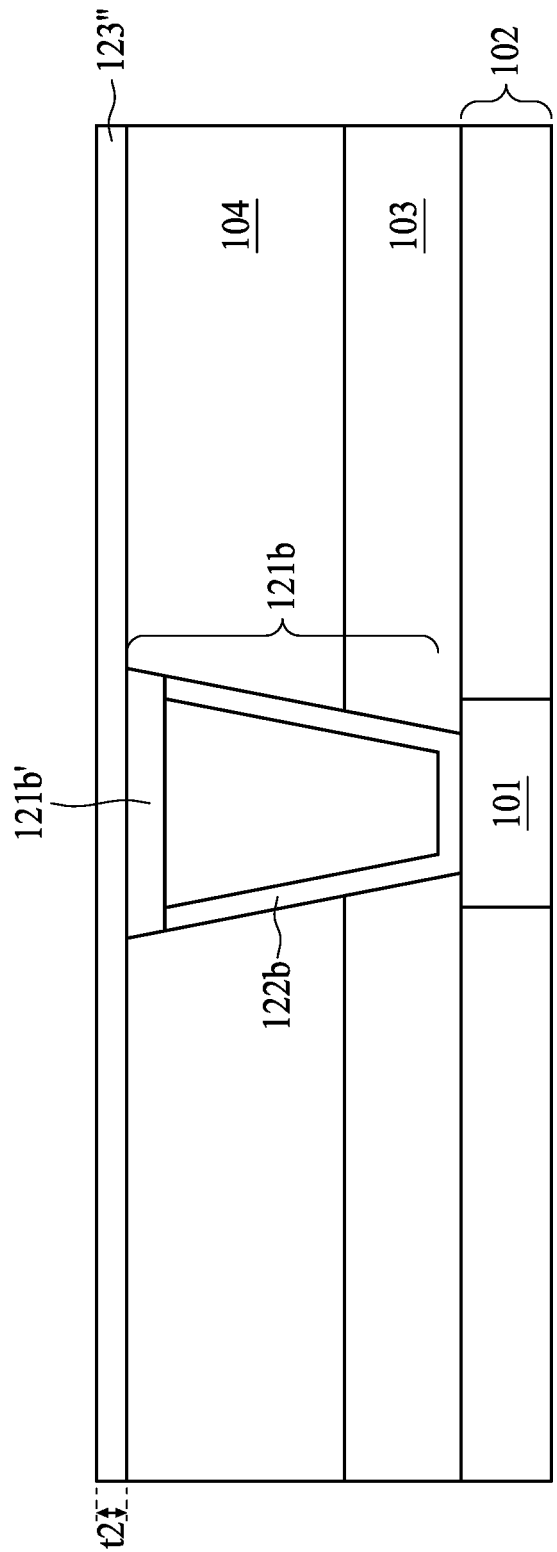

Referring to FIG. 17D and FIG. 17E, FIG. 17E is a cross section of the semiconductor structure 300C during intermediate stages of manufacturing operations, in accordance with some embodiments of the present disclosure. A planarization operation (such as chemical mechanical planarization operation) is optionally performed from a top surface S123" of the bottom electrode layer 123", wherein a thickness t1 of the bottom electrode layer 123" may be reduced to a thickness t2 less than the thickness t1. In some embodiments, the planarized top surface of the bottom electrode layer 123" may provide a finer surface for forming an MTJ layer 130' by virtue of lattice orientation, as will be discussed in FIG. 17F.

Figure 17F:
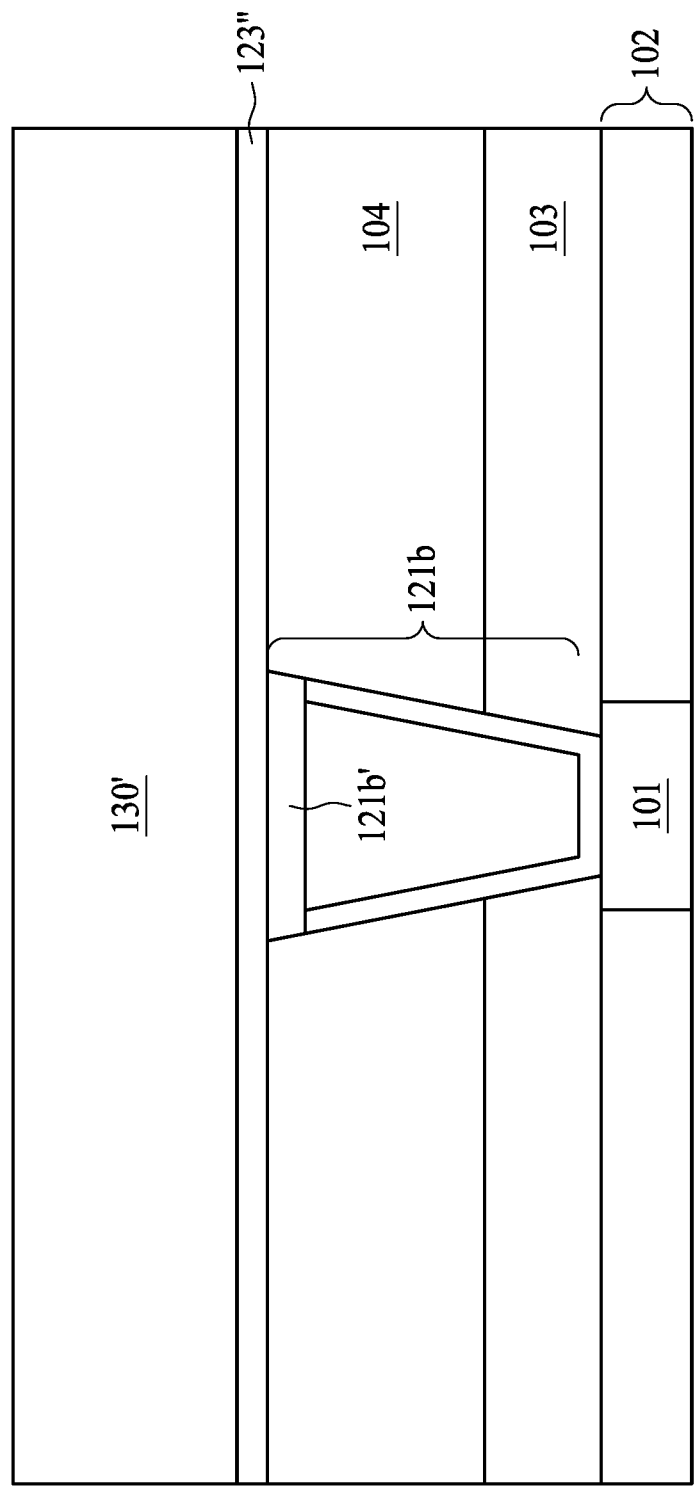

Referring to FIG. 17F, FIG. 17F is a cross section of the semiconductor structure 300C during intermediate stages of manufacturing operations, in accordance with some embodiments of the present disclosure. Subsequently the MTJ layer 130' is formed above the bottom electrode layer 123". As previously discussed, MTJ layer 130' is preferred to be formed on a (001) lattice surface, or a surface similar to (001) lattice plane. Herein the bottom electrode layer 123" directly contacting with a bottom surface of the MTJ layer 130' may prevent the MTJ layer 130' from following the lattice orientation of the bottom electrode via 121*b*, e.g., tungsten.

Figure 17G:
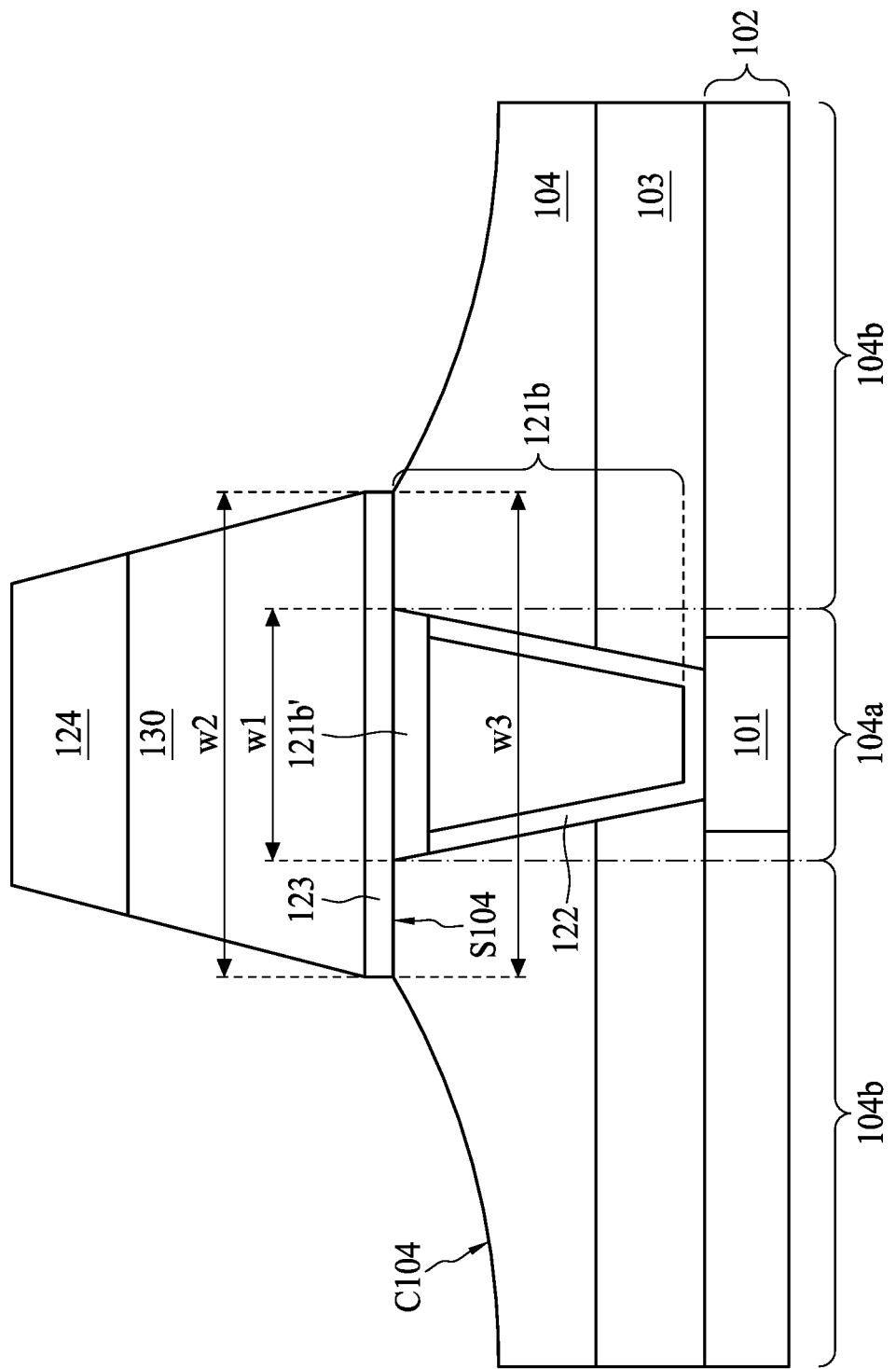

Referring to FIG. 17G, FIG. 17G is a cross section of the semiconductor structure 300C during intermediate stages of manufacturing operations, in accordance with some embodiments of the present disclosure. The top electrode 124 is subsequently formed above the MTJ layer 130', wherein the top electrode 124 can be used as a photomask. The MTJ layer 130' and the bottom electrode layer 123" are patterned by the top electrode 124 to form the MTJ 130 and the bottom electrode 123 respectively, wherein the MTJ 130 has the second width w2 greater than the first width w1 of the top surface of the bottom electrode via 121b, the bottom electrode 123 has the third width w3 greater than the first width w1, as the MTJ 130 may have a shape tapering away from the bottom electrode via 121b. The formation of the MTJ layer 130 may entail etching operation, such as ion beam etching (IBE) operation. The etching operation may remove a predetermined portion of the MTJ layer 130' and recess a portion of the oxide layer 104. Thereby the top surface C104 of the second portion 104b exposed from the top electrode 124 and/or the remaining MTJ 130 is lower than the top surface S104 of the first portion 104a, and the top surface C104 of the oxide layer 104 is concaved toward the $N^{th}$ metal layer 102. In some embodiments, the bottom electrode 123 being wider than the top surface of the bottom electrode via 121b may reduce oxide loss from the first portion 104a of the oxide layer 104. In some embodiments, the bottom electrode 123 being wider than the top surface of the amorphous cap 121b' may reduce the risk of tantalum residues being sputtered therefrom under etching operation.

Figure 17H:
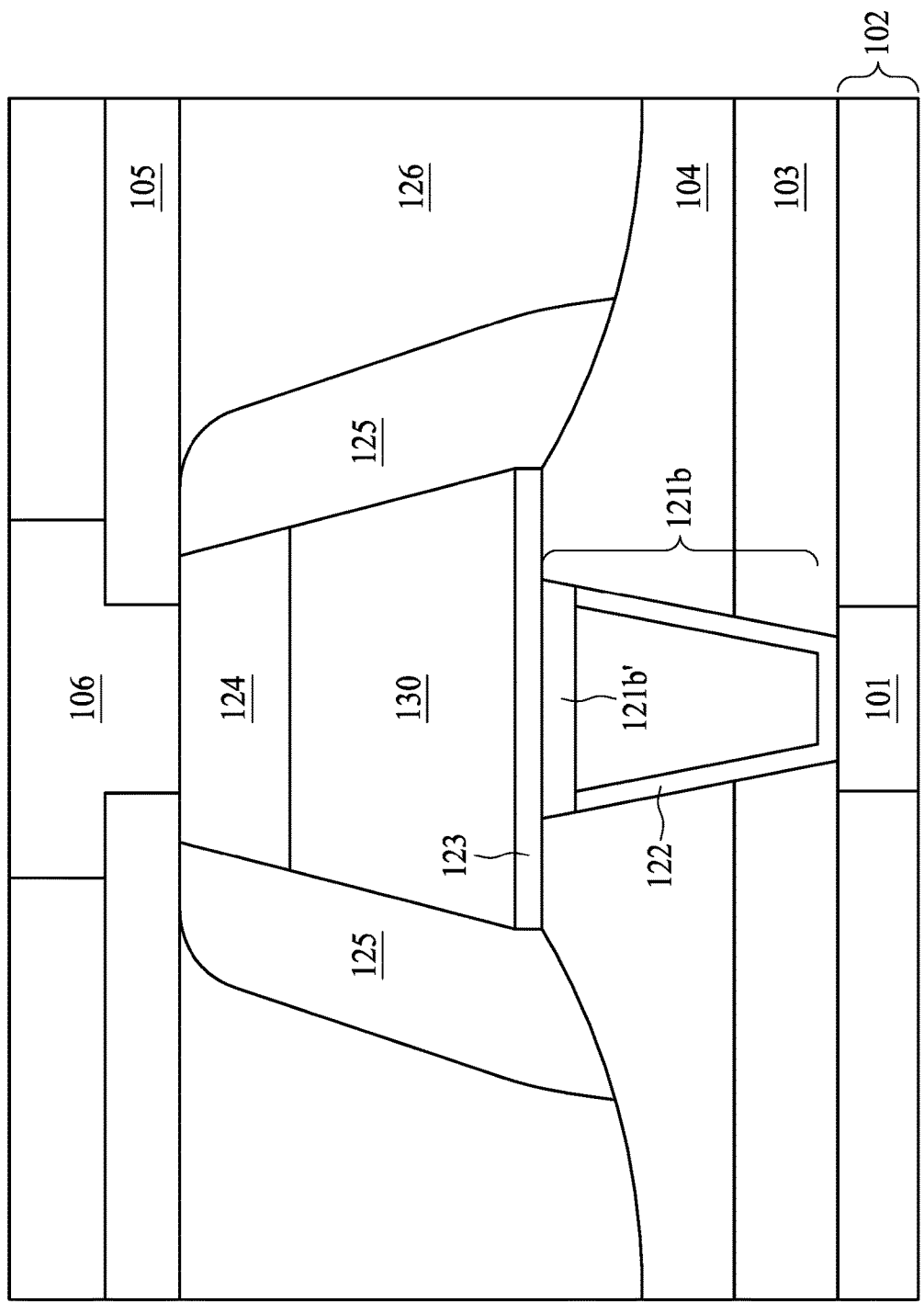

Referring to FIG. 17H, FIG. 17H is a cross section of the semiconductor structure 300C during intermediate stages of manufacturing operations, in accordance with some embodiments of the present disclosure. The sidewall spacer 125 is subsequently formed on the sidewall of the MTJ 130 and/or the top electrode 124 to prevent the MTJ 130 from being deteriorated by oxidation. The dielectric layer 126 is formed above the oxide layer 104, than the $(N+1)^{th}$ metal layer 105 and the contact 106 is formed above the dielectric layer 126, wherein the contact 106 may be electrically connected to the top electrode 124.

The present disclosure provides semiconductor structures and the fabrication methods thereof, wherein a critical dimension of a bottom width of an MTJ is greater than a top width of a bottom electrode via under the MTJ layer. Thereby the risk of the tantalum-containing material from the bottom electrode via and/or a barrier layer surrounding the bottom electrode via may be lowered. The risk of shortage induced by tantalum-containing residue may also be alleviated by replacing the materials of the bottom electrode via, the barrier layer, or a material of the MTJ while ensuring the formation of the MTJ per se follows a certain lattice orientation with acceptable uniformity. In addition, reducing operation time of MTJ etching operation may also lower the risk of shortage induction, which may be achieved by omitting the bottom electrode and disposing a substitutional layer on the top portion of the bottom electrode via.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide a semiconductor structure, including a bottom electrode via, a top surface of the bottom electrode via having a first width, a barrier layer surrounding the bottom electrode via, and a magnetic tunneling junction (MTJ) over the bottom electrode via, a bottom of the MTJ having a second width, the first width being narrower than the second width.

Some embodiments of the present disclosure provide a semiconductor structure, including a bottom electrode via, a barrier layer surrounding the bottom electrode via, an oxide layer surrounding the bottom electrode via, a top surface of the oxide layer proximal to the bottom electrode via being coplanar with a top surface of the bottom electrode via, and a magnetic tunneling junction (MTJ) over the bottom electrode via.

Some embodiments of the present disclosure provide a method for manufacturing a semiconductor structure, including forming an oxide layer, forming a first via trench in the oxide layer, forming a barrier layer in the first via trench, forming a bottom electrode via in the first via trench, forming a magnetic tunneling junction (MTJ) layer above the bottom electrode via, and patterning the MTJ layer to form an MTJ having a bottom width greater than a top width of the bottom electrode via.

What is claimed is:

1. A semiconductor structure, comprising:
    a bottom electrode via, comprising a lower portion and an upper portion above the lower portion, wherein a top surface of the bottom electrode via having a first width;
    a barrier layer surrounding the bottom electrode via and comprising a first portion between the lower portion and the upper portion of the bottom electrode via; and
    a magnetic tunneling junction (MTJ) over the bottom electrode via, a bottom of the MTJ having a second width, the first width being narrower than the second width.

2. The semiconductor structure of claim 1, further comprising a bottom electrode between the bottom electrode via and the MTJ.

3. The semiconductor structure of claim 2, wherein the bottom electrode via comprises a portion tapering away from the MTJ and in contact with the bottom electrode.

4. The semiconductor structure of claim 3, wherein the portion tapering away from the MTJ is laterally surrounded by the barrier layer.

5. The semiconductor structure of claim 2 further comprising an oxide layer surrounding the barrier layer, wherein the barrier layer has a top surface substantially coplanar with a top surface of the oxide layer.

6. The semiconductor structure of claim 5, wherein the top surface of the oxide layer comprises a first portion substantially coplanar with a bottom surface of the bottom electrode.

7. The semiconductor structure of claim 6, wherein the top surface of the oxide layer further comprises a second portion lower than the first portion.

8. The semiconductor structure of claim 1, wherein the barrier layer comprises tantalum or tantalum derivatives.

9. A semiconductor memory structure, comprising:
- a bottom electrode via;
- a barrier layer surrounding the bottom electrode via;
- an oxide layer surrounding the bottom electrode via, wherein a first portion of a top surface of the oxide layer proximal to the bottom electrode via is coplanar with a top surface of the bottom electrode via, a second portion of the top surface of the oxide layer is adjacent to the first portion and is lower than the first portion; and
- a magnetic tunneling junction (MTJ) over the bottom electrode via.

10. The semiconductor memory structure of claim 9, wherein the bottom electrode via has a portion tapering away from the MTJ.

11. The semiconductor memory structure of claim 9, further comprising a bottom electrode between the MTJ and the bottom electrode via, wherein the bottom electrode has a bottom surface contacting the top surface of the oxide layer.

12. The semiconductor memory structure of claim 9, wherein the MTJ comprises a seed layer free of tantalum or tantalum derivatives.

13. The semiconductor memory structure of claim 9, wherein the bottom electrode via comprises titanium nitride, and the barrier layer comprises tantalum.

14. The semiconductor memory structure of claim 9, wherein the bottom electrode via comprises tungsten, and the barrier layer comprises titanium nitride.

15. The semiconductor memory structure of claim 9, wherein a width of the bottom electrode is wider than a width of the bottom electrode via.

16. The semiconductor memory structure of claim 9, further comprising a sidewall spacer over a sidewall of the MTJ, wherein the sidewall spacer is in direct contact with the second portion of the top surface of the oxide layer.

17. A semiconductor structure, comprising:
- a bottom electrode via;
- a barrier layer surrounding the bottom electrode via;
- an oxide layer surrounding the barrier layer, wherein the oxide layer has a concaved portion, the bottom electrode via is free from a coverage of a vertical projection of the concaved portion;
- a magnetic tunneling junction (MTJ) over the bottom electrode via; and
- a sidewall spacer surrounding the MTJ, wherein a bottom surface of the sidewall spacer is in direct contact with a top surface of the concaved portion.

18. The semiconductor structure of claim 17, wherein the barrier layer comprises tantalum or tantalum derivatives.

19. The semiconductor structure of claim 17, wherein a portion of the oxide layer is spacing between the barrier layer and the sidewall spacer.

20. The semiconductor structure of claim 17, wherein the MTJ has a profile tapering away from the oxide layer, and the bottom electrode via has a profile tapering away from the MTJ.

* * * * *